US009666299B2

(12) United States Patent
Matsunaga

(10) Patent No.: US 9,666,299 B2
(45) Date of Patent: May 30, 2017

(54) NON-VOLATILE SEMICONDUCTOR STORAGE DEVICE

(71) Applicant: KABUSHIKI KAISHA TOSHIBA, Minato-ku (JP)

(72) Inventor: Naoki Matsunaga, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/257,773

(22) Filed: Sep. 6, 2016

(65) Prior Publication Data

US 2016/0372209 A1    Dec. 22, 2016

Related U.S. Application Data

(63) Continuation of application No. 14/331,893, filed on Jul. 15, 2014, now Pat. No. 9,466,370, which is a (Continued)

(30) Foreign Application Priority Data

Dec. 9, 2011 (JP) .................................. 2011-269942

(51) Int. Cl.
*G11C 11/34* (2006.01)
*G11C 16/34* (2006.01)
(Continued)

(52) U.S. Cl.
CPC ........ *G11C 16/3495* (2013.01); *G06F 3/0619* (2013.01); *G06F 3/0655* (2013.01);
(Continued)

(58) Field of Classification Search
CPC ............ G11C 16/08; G11C 8/08; G11C 16/30
(Continued)

(56) References Cited

U.S. PATENT DOCUMENTS 6,031,762 A    2/2000  Saitoh
7,009,881 B2   3/2006  Noguchi
(Continued)

FOREIGN PATENT DOCUMENTS

JP         11-53266    2/1999
JP       2007-316779  12/2007
(Continued)

*Primary Examiner* — Son Dinh
(74) *Attorney, Agent, or Firm* — Oblon, McClelland, Maier & Neustadt, L.L.P.

(57) ABSTRACT

According to one embodiment, there is provided a non-volatile semiconductor storage device including a non-volatile memory, a monitoring section, a determining section, and a notification processing section. The non-volatile memory includes a plurality of memory cells driven by word lines and a voltage generating section that generates a read voltage to be applied to the word lines. The monitoring section monitors a change in a threshold distribution of the plurality of memory cells upon performing a read processing to read data from the plurality of memory cells by applying the read voltage to the word lines. The determining section determines a degree of deterioration of the non-volatile memory in accordance with a monitoring result by the monitoring section. The notification processing section notifies a life of the non-volatile memory in accordance with a determining result by the determining section.

11 Claims, 19 Drawing Sheets

Related U.S. Application Data continuation of application No. 13/531,791, filed on Jun. 25, 2012, now Pat. No. 8,804,435.

(51) Int. Cl.

| | | |
|---|---|---|
| *G11C 11/56* | (2006.01) | |
| *G11C 16/04* | (2006.01) | |
| *G11C 16/06* | (2006.01) | |
| *G06F 3/06* | (2006.01) | |
| *G11C 16/26* | (2006.01) | |
| *G11C 29/52* | (2006.01) | |

(52) U.S. Cl.
CPC ........ *G06F 3/0679* (2013.01); *G11C 11/5628* (2013.01); *G11C 16/04* (2013.01); *G11C 16/0483* (2013.01); *G11C 16/06* (2013.01); *G11C 16/26* (2013.01); *G11C 16/3404* (2013.01); *G11C 16/349* (2013.01); *G11C 29/52* (2013.01)

(58) Field of Classification Search
USPC .............................. 365/185.23, 185.24, 236
See application file for complete search history.

(56) References Cited

U.S. PATENT DOCUMENTS

| | | | |
|---|---|---|---|
| 8,804,435 | B2 | 8/2014 | Matsunaga |
| 2010/0124119 | A1* | 5/2010 | Lee .......................... G11C 8/08 365/185.18 |

FOREIGN PATENT DOCUMENTS

| | | |
|---|---|---|
| JP | 2008-539533 | 11/2008 |
| JP | 2010-198219 | 9/2010 |
| JP | 2011-100519 | 5/2011 |
| WO | WO 2006/118646 A2 | 11/2006 |

* cited by examiner

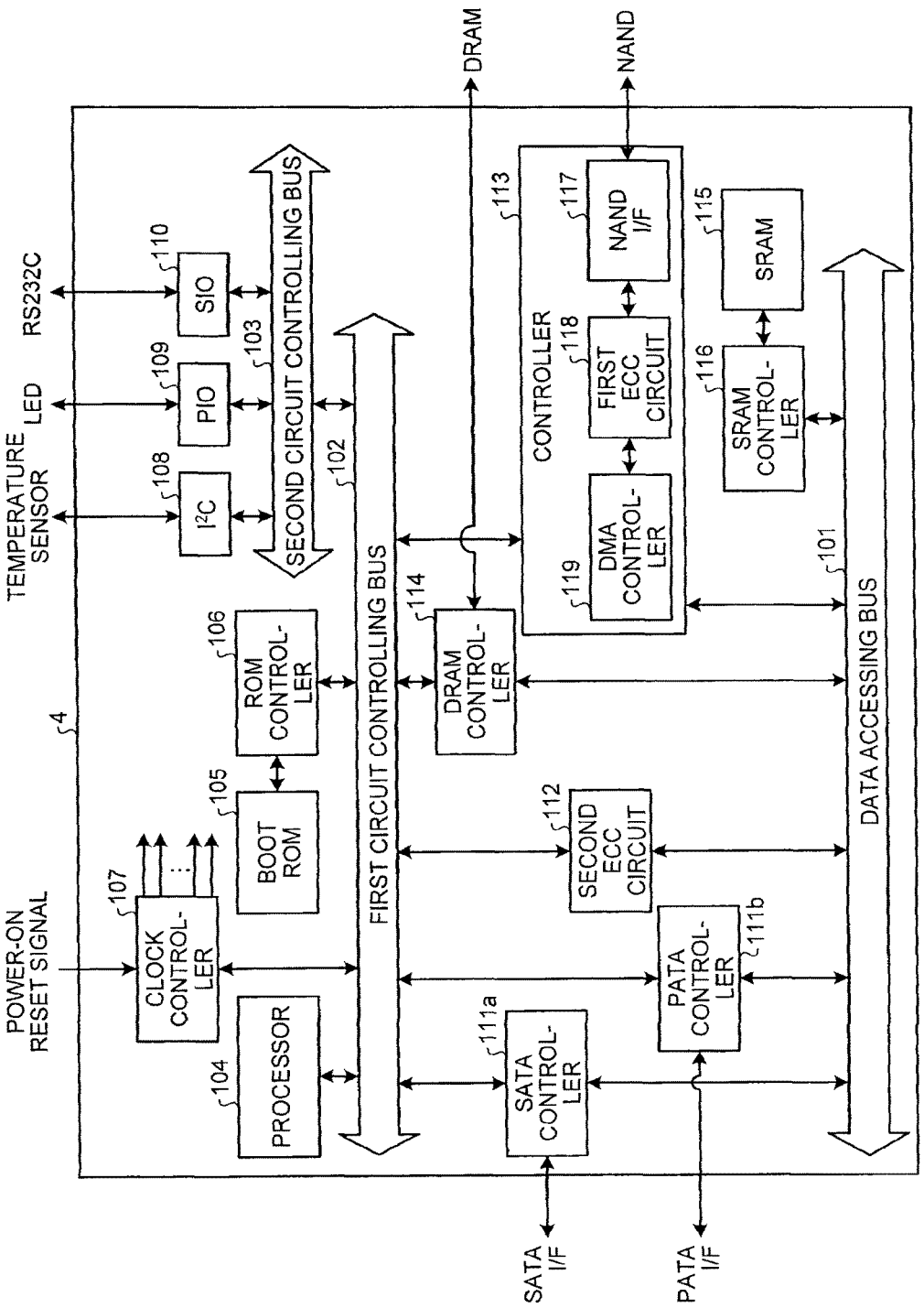

NON-VOLATILE SEMICONDUCTOR STORAGE DEVICE

CROSS-REFERENCE TO RELATED APPLICATIONS

This application is a continuation of and claims the benefit of priority under 35 U.S.C. §120 from U.S. application Ser. No. 14/331,893 filed Jul. 15, 2014, and is a continuation of and claims the benefit of priority under 35 U.S.C. §120 from U.S. Ser. No. 13/531,791 filed Jun. 25, 2012, and claims the benefit of priority under 35 U.S.C. §119 from Japanese Patent Application No. 2011-269942 filed Dec. 9, 2011; the entire contents of each of which are incorporated herein by reference.

FIELD

Embodiments described herein relate generally to a non-volatile semiconductor storage device.

BACKGROUND

In a non-volatile semiconductor storage device, in performing a read operation from a non-volatile memory, a voltage value to be read from memory cells changes due to number of writing/erasure, a data retaining period, and a surrounding temperature. If necessary, a correction by an ECC (Error Check and Correction) is performed. However, conventionally, such changes in the voltage value and a degree of correction by the ECC are unknown to a user, and due to this, the use keeps using the non-volatile memory despite a nearing end of the lifetime thereof, and this may in cases cause an abrupt loss of data that had been stored in the non-volatile memory.

BRIEF DESCRIPTION OF THE DRAWINGS

FIG. 3 is a diagram showing a configuration of a drive control circuit according to the first embodiment;

DETAILED DESCRIPTION

In general, according to one embodiment, there is provided a non-volatile semiconductor storage device including a non-volatile memory, a monitoring section, a determining section, and a notification processing section. The non-volatile memory includes a plurality of memory cells driven by word lines and a voltage generating section that generates a read voltage to be applied to the word lines. The monitoring section monitors a change in a threshold distribution of the plurality of memory cells upon performing a read processing to read data from the plurality of memory cells by applying the read voltage to the word lines. The determining section determines a degree of deterioration of the non-volatile memory in accordance with a monitoring result by the monitoring section. The notification processing section notifies a life of the non-volatile memory in accordance with a determining result by the determining section.

Exemplary embodiments of a non-volatile semiconductor storage device will be explained below in detail with reference to the accompanying drawings. The present invention is not limited to the following embodiments.

First Embodiment

In the present embodiment, in a non-volatile semiconductor storage device (for example, an SSD (Solid State Drive)) provided with a non-volatile memory (for example, a NAND type memory) including a plurality of memory cells of the present embodiment, a threshold distribution of the plurality of memory cells upon performing a read processing for data in the non-volatile memory is monitored in order to determine a degree of deterioration of the non-volatile memory.

After having monitored the threshold distribution of the plurality of memory cells, a monitored result and a threshold that is set in advance are compared, and based on this comparison result, a degree of deterioration in blocks in the non-volatile memory is determined. Further, according to a determination result of the degree of deterioration, a determination is made on whether a life of the non-volatile memory is ending or not, and if the life is ending, such fact is notified to a user. The present embodiment provides such a method of predicting lifetime.

Hereafter, although a case in which the non-volatile semiconductor storage device is an SSD (Solid State Drive) will be explained specifically with reference to the drawings, the present embodiment is similarly adaptable to a case in which the non-volatile semiconductor storage device is for example a memory card.

Firstly, with reference to FIG. 1 to FIG. 4, a configuration of the non-volatile semiconductor storage device and a configuration of a NAND type flash memory and the like will be explained, and thereafter, with reference to FIG. 5 to FIG. 10, a configuration and an operation and the like of the non-volatile semiconductor storage device that is one feature of the present embodiment will be explained.

Figure 1:
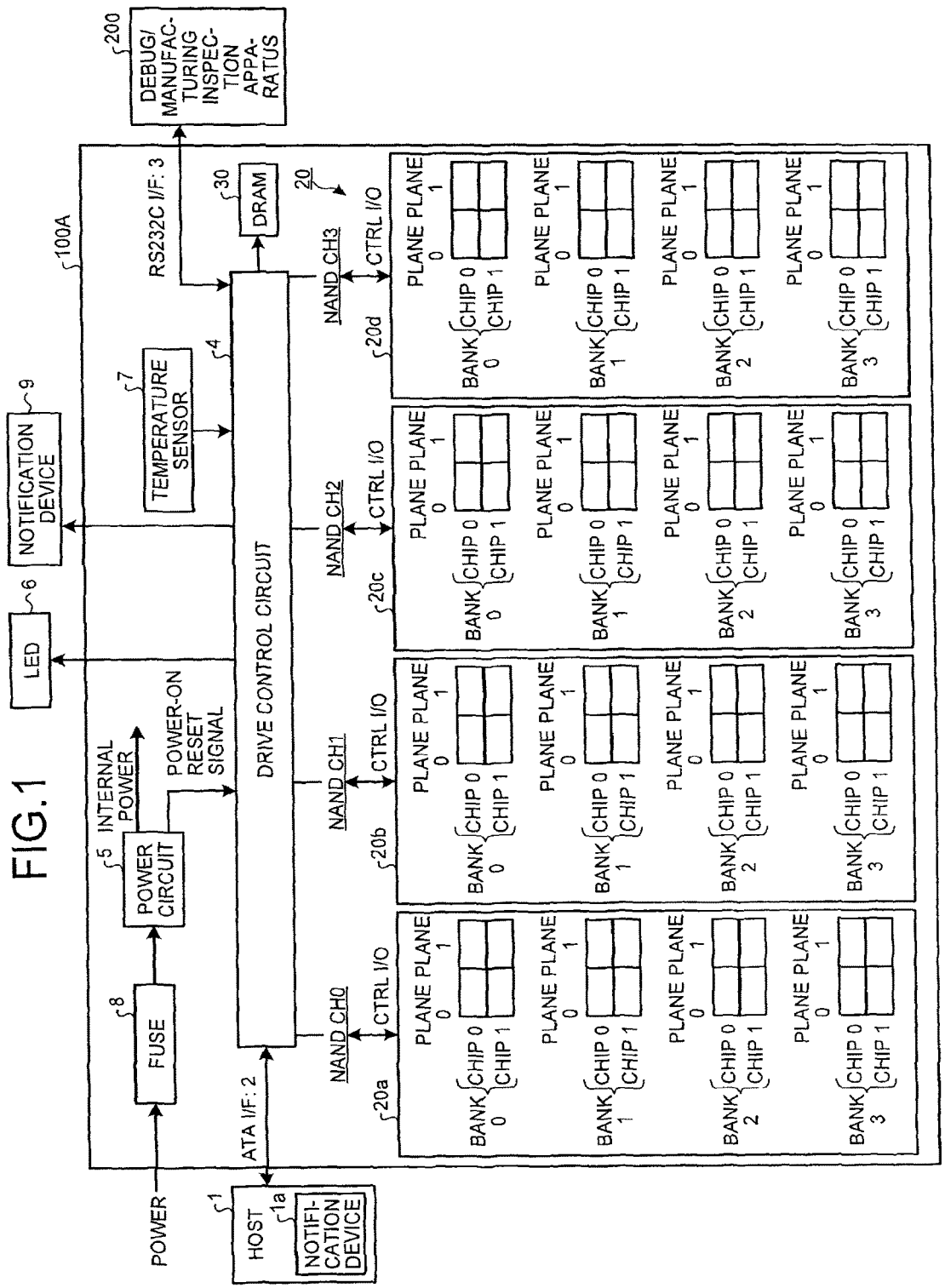
FIG. 1 is a diagram showing a hardware configuration of a non-volatile semiconductor storage device according to a first embodiment.

FIG. 1 is a block diagram showing an example of a configuration of an SSD 100A as the non-volatile semiconductor storage device. The SSD 100A includes a host connection interface (a host I/F 40 described later) for connecting to a host device (hereafter abbreviated as host) 1. FIG. 1 shows a case in which the host I/F 40 is a memory connection interface such as an ATA interface (ATA I/F) 2. The SSD 100A is connected to the host 1 such as a personal computer or a CPU core through the ATA I/F 2 (host I/F 40), and functions as an external memory of the host 1. Further, the SSD 100A can send and receive data with a debug/manufacturing inspection apparatus 200 through a communication interface 3 such as an RS232C interface (RS232C I/F). Note that, the host 1 includes a notification device 1a.

The SSD 100A includes a NAND type flash memory (hereafter abbreviated as NAND memory) 20 as the non-volatile semiconductor memory including a plurality of memory cells, a drive control circuit 4 as the controller, a DRAM 30 as the volatile semiconductor memory, a power circuit 5, a state display LED 6, a temperature sensor 7 that detects temperature inside the drive, a fuse 8, and a notification device 9 for state notification.

The power circuit 5 generates a plurality of different internal direct current power voltages from an external direct current power supplied from a power circuit on a host 1 side, and supplies these internal direct current power voltages to respective circuits in the SSD 100A. Further, the power circuit 5 detects a rising edge of the external power, generates a power-on reset signal, and supplies the same to the drive control circuit 4.

The fuse 8 is provided between the power circuit on the host 1 side and the power circuit 5 inside the SSD 100A. When an over current is supplied from the external power circuit, the fuse 8 is cut, and erroneous operations of the internal circuits are prevented.

The NAND memory 20 includes for example four parallel operational elements 20a to 20d that perform four parallel operations, and these four parallel operational elements 20a to 20d are connected to the drive control circuit 4 by four channels (ch0 to ch3). Each of the parallel operational elements 20a to 20d is configured of a plurality of banks capable of bank interleaving. That is, each of the parallel operational elements are configured for example of four banks (Bank 0 to Bank 3), and each bank is configured of a plurality of NAND memory chips, for example, two memory chips (Chip 0, Chip 1).

Each memory chip is for example divided into two districts (District) of a plane 0 and a plane 1, each of which includes a plurality of physical blocks. The plane 0 and plane 1 include peripheral circuits that are independent of one another (such as a row decoder, a column decoder, a page buffer, and a data cache) and are capable of concurrently performing erasing/writing/reading by using a double speed mode.

Accordingly, each NAND memory chip of the NAND memory 20 is capable of parallel operations by the plurality of channels, bank interleaving operations by the plurality of banks (that is, by the plurality of NAND devices), interleaving operations by a plurality of chips in the same bank (that is, the same NAND device), and parallel operations by a double speed mode using a plurality of planes. Note that, each memory chip may be divided into two or more plurality of planes, or may not be divided at all.

The DRAM 30 functions as a memory for data transfer cache and operation district between the host 1 and the NAND memory 20. Contents to be stored in the memory for operation district of the DRAM 30 may for example be a master table (snap shot) in which respective managing tables stored in the NAND memory 20 are expanded upon a startup, or log information that is a change difference in a managing table.

Note that, instead of the DRAM 30, it is possible to use a non-volatile random access memory such as a FeRAM (Ferroelectric Random Access Memory), an MRAM (Magnetoresistive Random Access Memory), a PRAM (Phase change Random Access Memory) and the like. In using the non-volatile random access memory, a part or all of operations for saving the respective managing tables and the like in the NAND memory 20 upon power shutdown may be omitted.

The drive control circuit 4 performs a data transfer control between the host 1 and the NAND memory 20 through the DRAM 30, and also controls the respective configurational elements in the SSD 100A. Further, the drive control circuit 4 has functions to supply the state display LED 6 with a status display signal, to receive the power-on reset signal from the power circuit 5, and to supply a reset signal and a clock signal to respective sections in the drive control circuit 4 and the SSD 100A.

Each NAND memory chip is configured by arranging a plurality of physical blocks that is a unit of data erasure.

Figure 2A:
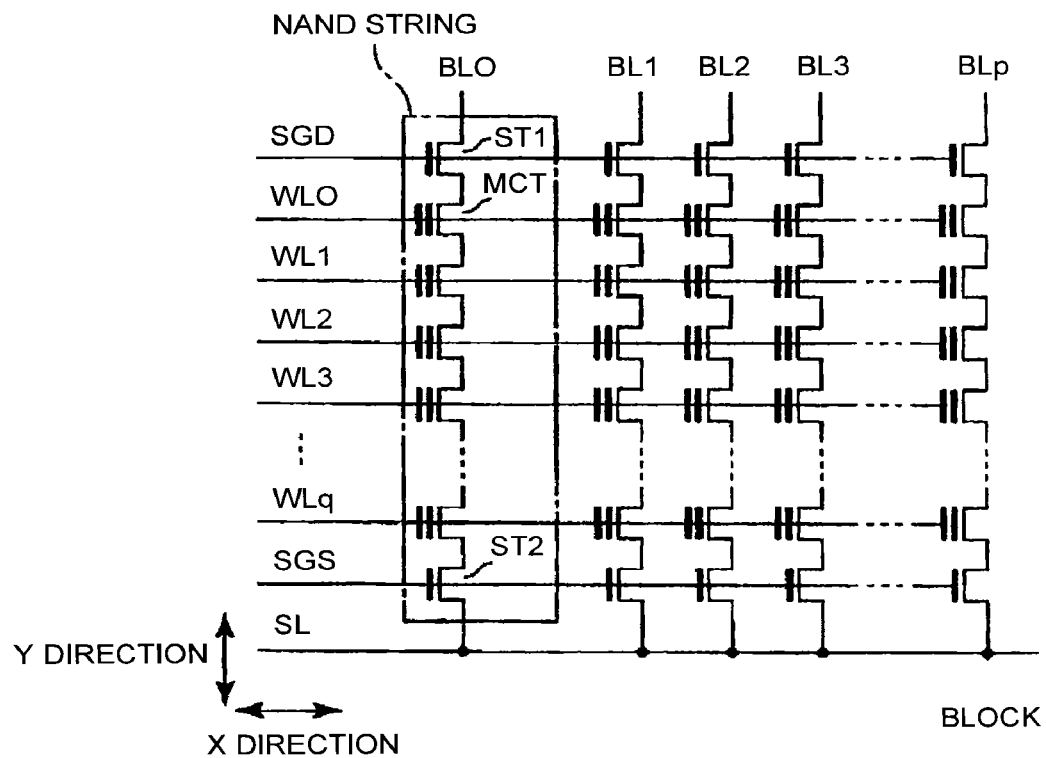
FIG. 2A and FIG. 2B are diagrams showing a circuit configuration and an operation of a non-volatile memory according to the first embodiment.

FIG. 2A is a circuit diagram showing an example of a configuration of one physical block included in the NAND memory. Each physical block includes (p+1) pieces of NAND strings arranged in order along an X direction (p is an integer equal to larger than 0). A select transistor ST1 included in each NAND string has its drain connected to bit lines BL0 to BLp and its gate connected commonly to a select gate line SGD. Further, a select transistor ST2 has its source commonly connected to a source line SL and its gate commonly connected to a select gate line SGS.

Each memory cell transistor (also referred to as a memory cell) MCT is configured of a MOSTFET (Metal Oxide Semiconductor Field Effect Transistor) having a laminated gate structure formed on a semiconductor substrate. The laminated gate structure includes a charge accumulating layer (floating gate electrode) formed on the semiconductor substrate with the gate insulating film and a control gate electrode formed on the charge accumulating layer with an inter-gate insulating film. The memory cell transistors MCT change threshold voltages in accordance with a number of electrons accumulated in the floating gate electrode, and stores data in accordance with this difference in the threshold voltages. The memory cell transistors MCT may be configured to store 1 bit, or may be configured to store multilevel (data of 2 bits or more).

Further, the memory cell transistors MCT are not limited to the configuration having the floating gate electrode, and they may have a structure such as a MONOS (Metal-Oxide Nitride-Oxide-Silicon) type capable of adjusting the threshold voltages by trapping charges at a nitride film interface that is the charge accumulating layer. Similarly for the memory cell transistors MCT with the MONOS structure, they may be configured to store 1 bit, or may be configured to store multilevel (data of 2 bits or more).

In each NAND string, (q+1) pieces of memory cell transistors MCT are arranged between the source of the select transistor ST1 and the drain of the select transistor ST2 so that their current paths are serially connected. That is, the plurality of memory cell transistors MCT is serially connected in a Y direction in a form of sharing a diffusion region (source region or drain region) among adjacent ones.

In each NAND string, the control gate electrodes are respectively connected to word lines WL0 to WLq in an order from the memory cell transistor MCT located on the most select gate line SGD side and on. Accordingly, the drain of the memory cell transistor MCT connected to the word line WL0 is connected to the source of the select transistor ST1, and the source of the memory cell transistor MCT connected to the word line WLq is connected to the drain of the select transistor ST2.

The word lines WL0 to WLq commonly connect the control gate electrodes of the memory cell transistors MCT between the NAND strings in the physical block. That is, the control gate electrodes of the memory cell transistors MCT that are in the same row in a block are connected to the same word line WL. These (p+1) pieces of memory cell transistors MCT connected to the same word line WL are handled as one page (physical page), and the writing of data and reading of data are performed for each of these physical pages.

Further, the bit lines BL0 to BLp commonly connect the drains of the select transistors ST1 between blocks. That is, the NAND strings in the same column in the blocks are connected to the same bit line BL.

Figure 2B:
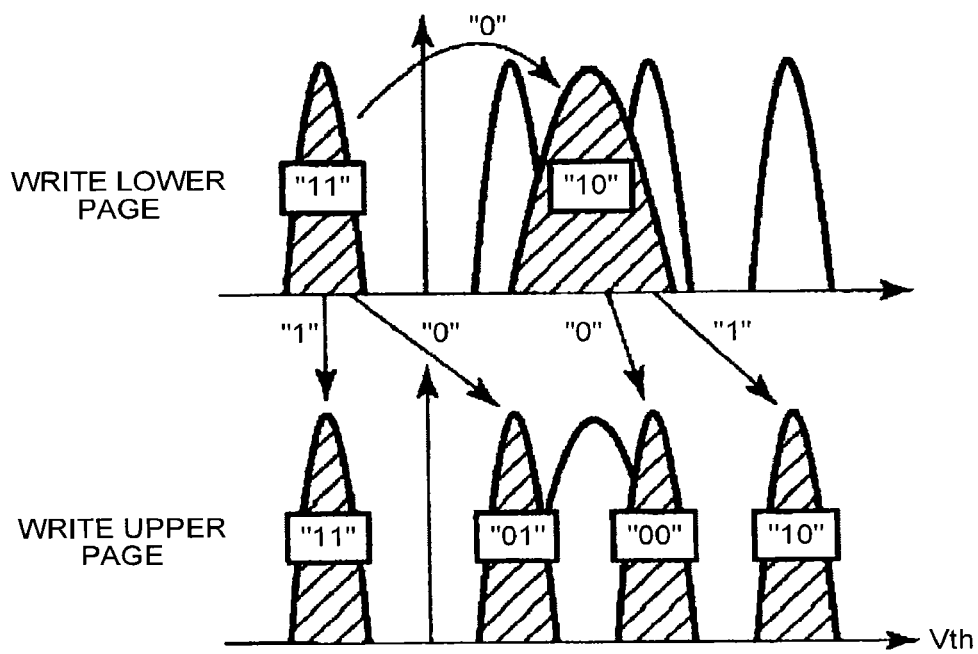

FIG. 2B is a schematic diagram showing a threshold distribution in a four-level data storing scheme which for example stores 2 bits in one memory cell transistor MCT. The four-level data storing scheme is capable of retaining one of four-level data "xy" defined by upper page data "x" and lower page data "y" in the memory cell transistors MCT.

For example, data "11", "01", "00" and "10" are allotted to the four-level data "xy" in an order of the threshold voltages of the respective memory cell transistors MCT. The data "11" is an erased state in which the threshold voltage of the memory cell transistor MCT is for example caused to be negative. Note that, a data allotting rule is not limited to this. Further, it may have a configuration in which a storage of 3 bits or more is performed in one memory cell transistor MCT.

In the writing operation of the lower page, data "10" is written by selectively writing lower bit data "y" to the memory cell transistor MCT with the data "11" (erased state). A threshold distribution of data "10" of the upper page before the writing is positioned at an intermediate position between threshold distributions of the data "01" and the data "00" of the upper page after the writing, or may be broader than the threshold distribution of the upper page after the writing. In the writing operation of the upper page, data "01" and data "00" are written in the memory cell of the data "11" and the memory cell of the data "10" respectively by selectively writing upper bit data "x". A simulation SLC mode performs writing by using only the lower page. The writing of the lower page is fast compared to the writing of the upper page.

FIG. 3 is a block diagram showing an example of a hardware internal configuration of the drive control circuit 4. The drive control circuit 4 includes a data accessing bus 101, a first circuit controlling bus 102, and a second circuit controlling bus 103. A processor 104 that controls an entirety of the drive control circuit 4 is connected to the first circuit controlling bus 102. A boot ROM 105 is connected to the first circuit controlling bus 102 via a ROM controller 106. A boot program that boots the respective managing programs (FW: firm wares) stored in the NAND memory 20 is stored in the boot ROM 105.

Further, a clock controller 107 is connected to the first circuit controlling bus 102. This clock controller 107 receives a power-on reset signal from the power circuit 5 shown in FIG. 1, and supplies a reset signal and the clock signal to the respective sections.

The second circuit controlling bus 103 is connected to the first circuit controlling bus 102. An I²C circuit 108 for receiving data from the temperature sensor 7 as shown in FIG. 1, a parallel IO (PIO) circuit 109 that supplies a status display signal to the status display LED 6, and a serial IO (SIO) circuit 110 that controls the RS232C I/F 3 are connected to the second circuit controlling bus 103.

A SATA interface controller (SATA controller) 111a, a PATA interface controller (PATA controller) 111b, a second ECC (Error Checking and Correction) circuit 112, a controller 113 that is the controller for the NANDs, and a DRAM controller 114 are connected to both the data accessing bus 101 and the first circuit controlling bus 102. The SATA controller 111a sends and receives data and command to and from the host 1 through a SATA interface (a part of the ATA interface 2 shown in FIG. 1). The PATA controller 111b sends and receives data and command to and from the host 1 through a PATA interface (a part of the ATA interface 2 shown in FIG. 1). A SRAM 115 that is used as the data operational district and a firm ware expanding district is connected to the data accessing bus 101 via a SRAM controller 116. The firm ware stored in the NAND memory 20 is transferred to the SRAM 115 upon the boot up by the boot program stored in the boot ROM 105.

The controller 113 includes a NAND I/F 117, a first ECC circuit 118, and a DMA controller 119 for a DMA transfer control. The NAND I/F 117 performs an interface process with the NAND memory 20. The DMA controller 119 for the DMA transfer control performs an access control between the NAND memory 20 and the DRAM 30. The first ECC circuit 118 performs encoding of a second correction code, and performs encoding and decoding of a first error correction code. The second ECC circuit 112 performs decoding of the second error correction code. The first error correction code and the second error correction code are for example humming codes, BCH (Bose Chaudhuri Hocquenghem) codes, RS (Reed Solomon) codes, or LDPC (Low Density Parity Check) codes and the like, and a correction ability of the second error correction code is higher than a correction ability of the first error correction code.

As shown in FIG. 1, in the NAND memory 20, the four parallel operational elements 20a to 20d are connected to the controller 113 inside the drive control circuit 4 through the four channels of the respective plurality of bits, and it is possible to operate the four parallel operational elements 20a to 20d in parallel. Further, the NAND memory 20 of each channel is divided into four banks capable of bank interleaving, and it is also possible to simultaneously access the plane 0 and the plane 1 of each memory chip. Accordingly, for each channel, it is possible to substantially control a maximum of eight physical blocks (four banks×two planes) simultaneously. That is, it is possible to perform processes such as writing to the maximum of eight physical blocks simultaneously.

Figure 4:
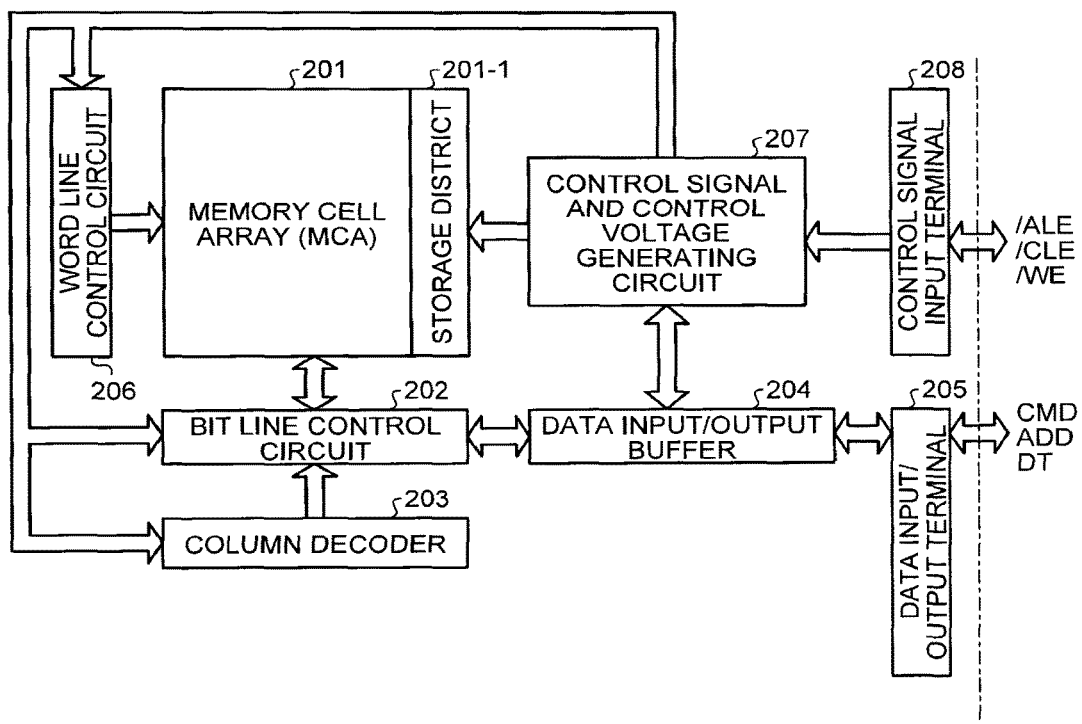
FIG. 4 is a diagram showing a functional configuration of the non-volatile memory according to the first embodiment.

FIG. 4 is a functional block diagram showing an example of one NAND memory chip (semiconductor non-volatile memory) shown in FIG. 1.

A memory cell array 201 includes a plurality of bit lines, a plurality of word lines, and a common source line, and memory cells formed of for example EEPROM cells and capable of having their data electrically rewritten are arranged in a matrix (so as to configure plural rows and plural columns). A bit line control circuit 202 for controlling the bit lines and a word line control circuit 206 for controlling the word lines are connected to this memory cell array 201.

The bit line control circuit 202 is connected to the plural rows of memory cells through the plural bit lines. The bit line control circuit 202 can read data in the memory cells through the bit lines, detect states of the memory cells through the bit lines, and write the memory cells by applying a write control voltage to the memory cells through the bit lines. A column decoder 203 and a data input/output buffer 204 are connected to the bit line control circuit 202.

A data storing circuit in the bit line control circuit 202 is selected by the column decoder 203. Data of the memory cells read by the data storing circuit is output outside through the data input/output buffer 204 from a data input/output terminal 205. The data input/output terminal 205 is connected to the drive control circuit 4 that is outside the memory chip.

This drive control circuit 4 receives the data output from the data input/output terminal 205. Further, the drive control circuit 4 outputs various commands CMD that control the operation of the NAND type flash memory, an address ADD, and data DT. Write data input from the drive control circuit 4 to the data input/output terminal 205 is supplied to the data storing circuit selected by the column decoder 203 through the data input/output buffer 204, and the commands and the address are supplied to a control signal and control voltage generating circuit 207.

The word line control circuit 206 is connected to plural rows of memory cells through plural word lines. This word line control circuit 206 selects a word line in the memory cell array 201, and applies a voltage that is necessary for reading, writing or erasing to the memory cells through the selected word line.

The memory cell array 201, the bit line control circuit 202, the column decoder 203, the data input/output buffer 204, and the word line control circuit 206 are connected to the control signal and control voltage generating circuit 207, and are controlled by this control signal and control voltage generating circuit 207.

The control signal and control voltage generating circuit 207 is connected to a control signal input terminal 208, and is controlled by various control signals such as an ALE (Address Latch Enable), a CLE (Command Latch Enable), a WE (Write Enable) that are input from the drive control circuit 4 through the control signal input terminal 208 as well as the commands CMD input from the drive control circuit 4 through the data input/output terminal 205 and the data input/output buffer 204.

This control signal and control voltage generating circuit 207 generates the voltage to be supplied to the word lines and the bit lines upon data writing, and also generates a voltage to be supplied to a well. The control signal and control voltage generating circuit 207 includes a booster circuit such as a charge pump circuit, and is configured capable of generating the write voltage, the read voltage and the erase voltage.

Further, as will be described later, the control signal and control voltage generating circuit 207 is capable of changing a level of the read voltage. That is, the control signal and control voltage generating circuit 207 has a function to shift the voltage to be applied to the word line upon the read operation (that is, the read voltage) to a + direction or a − direction upon receiving the various control signals input through the control signal input terminal 208 and the commands CMD input through the data input/output terminal 205 and the data input/output buffer 204.

The bit line control circuit 202, the column decoder 203, the word line control circuit 206, and the control signal and control voltage generating circuit 207 configure a write circuit and a read circuit.

The memory cell array 201 includes a storage district 201-1 for storing an ECC (Error Correction Code) in addition to a storage district for storing main data.

Figure 7:
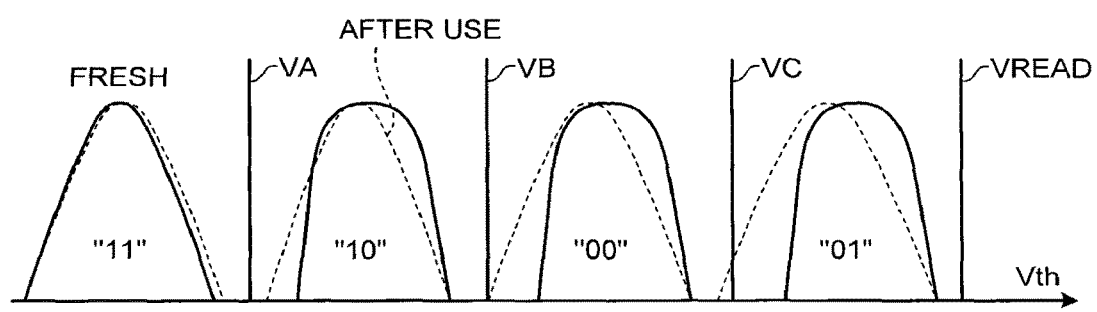
FIG. 7 is a diagram showing a threshold distribution of a plurality of memory cells according to the first embodiment.
Figure 8:
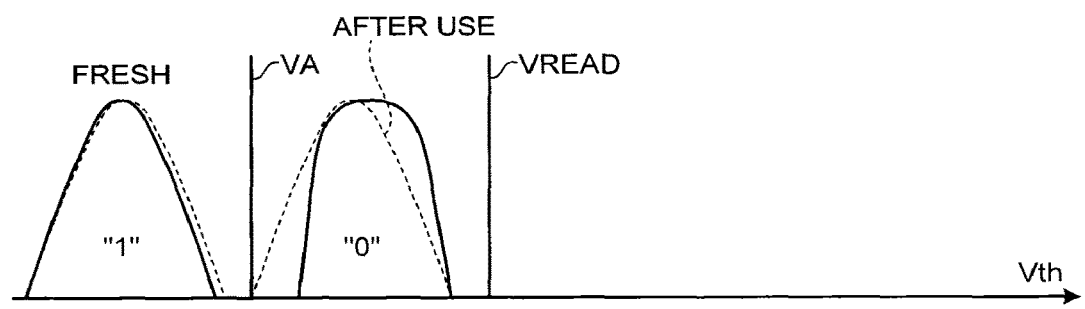
FIG. 8 is a diagram showing the threshold distribution of the plurality of memory cells according to the first embodiment.

In the NAND memory 20 of the SSD 100A, in cases such as when the written data is not accessed over a long period of time, a phenomenon may occur in each memory cell transistor MT in which electrons are discharged from its floating gate, and the threshold voltage is lowered (see FIG. 7 and FIG. 8). This phenomenon tends to occur easily when the gate insulating film of each memory cell transistor MT is deteriorated by for example an increase in a number of writing/erasure, the increase in the data retaining period, the increase in the surrounding temperature, and the like. Due to this, since a correlation exists between the changes in the threshold distribution of the plurality of memory cells (that is, the plurality of memory cell transistors MT) and the deterioration of the plurality of memory cells, the present embodiment for example utilizes this correlation to monitor a degree of deterioration of the NAND memory 20.

Figure 5:
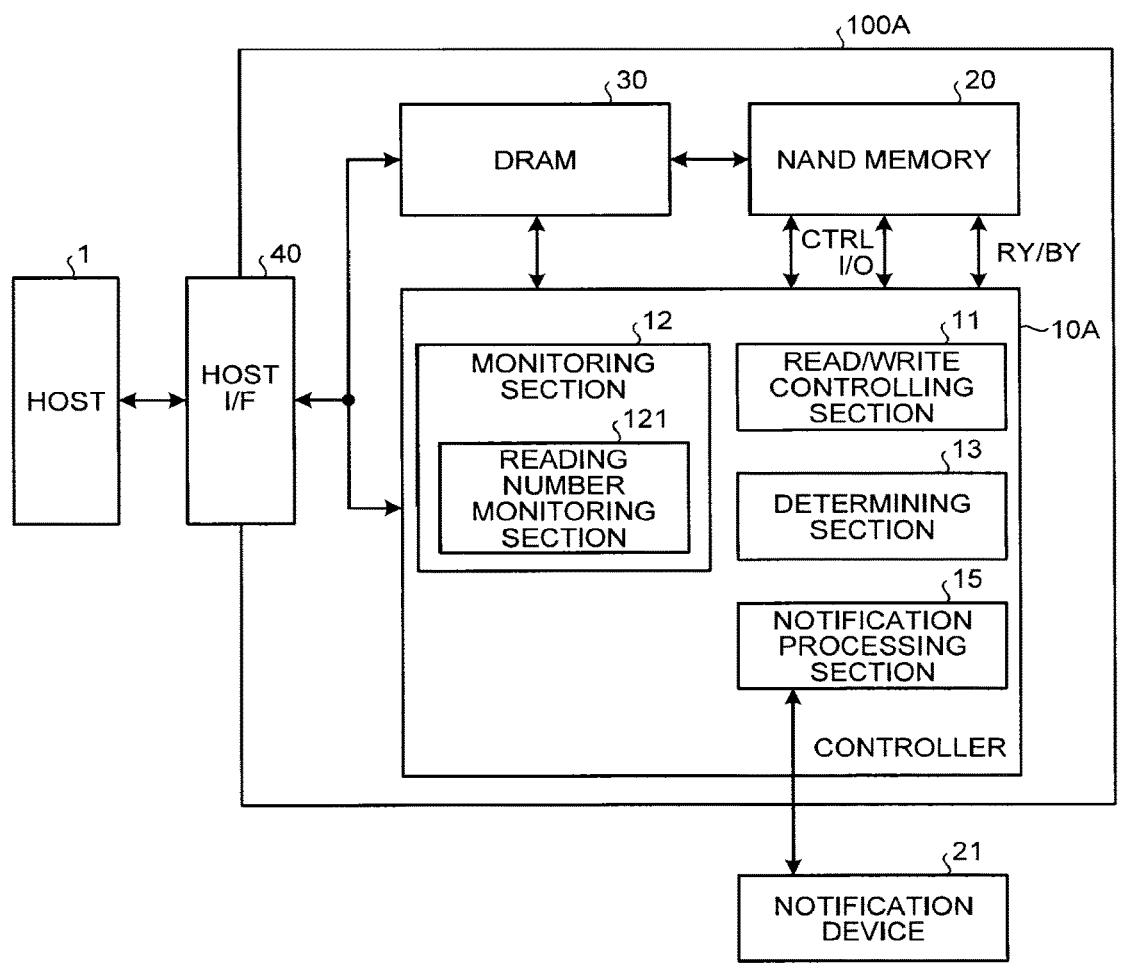
FIG. 5 is a diagram showing a functional configuration of the non-volatile semiconductor storage device according to the first embodiment.

Next, a configuration of the SSD 100A will be explained with reference to FIG. 5. FIG. 5 is a functional block diagram showing an example of a functional configuration of the SSD as the non-volatile semiconductor storage device according to the first embodiment.

The SSD 100A includes a controller 10A (drive control circuit 4), the NAND memory 20, the DRAM 30, and the host I/F 40.

The NAND memory 20 stores user data designated by the host 1, and stores managing information managed by the DRAM for a backup. The NAND memory 20 includes the memory cell array in which the plurality of memory cells is arranged in a matrix, and each memory cell is capable of a multilevel storage by using an upper page and a lower page. The NAND memory 20 is configured of a plurality of NAND memory chips, and each NAND memory chip is configured by arranging a plurality of physical blocks, which is the unit of data erasure. Further, the writing of the data and the reading of the data are performed in the NAND memory 20 for each physical page. The physical block is configured of a plurality of physical pages.

A physical block address is a fixed address allotted to a physical block. A logical block address is an address designated by the host 1 and is a changeable address allotted to a logical block, which is a virtual block. The logical block refers for example to a virtual block that is configured by combining a plurality of physical blocks.

The DRAM 30 is used as a storing section for data transfer and information management. Specifically, the storing section for the data transfer (a cache district for the data transfer) is used for temporarily storing data to which a write request had been made from the host 1 before writing it into the NAND memory 20, or for temporarily storing data to which a read request has been made from the host 1 after having read it from the NAND memory 20. Further, as the storing section for the information management, it is used for storing various types of managing information including managing information for managing storing position of the data stored in the NAND memory 20 (such as an association of a logical address and physical addresses), managing information for managing a reading number to be described later, in the physical block units.

A read voltage managing table (not shown) and a reading number managing table (not shown) are stored in the NAND memory 20, and these tables are read from the NAND memory 20 upon a system boot up, and are stored in the DRAM 30. The read voltage managing table for example has a table structure that indicates a read voltage for each address specifying respective word lines in one memory chip (that is, address supplied from the control signal and control voltage generating circuit 207 to the word line control circuit 206). That is, according to the read voltage managing table, the read voltage is recorded for each physical page. Note that, in the case of employing the multilevel-storing memory cells, the read voltage managing table is prepared for each of a plurality of thresholds. The reading number managing table is a table for managing the reading number to be described later in the physical block units (physical block address units), and the latest reading number that had actually been monitored is recorded as the reading number.

The controller 10A contains software for performing the data transfer control between the host 1 and the NAND memory 20 through the DRAM 30, and the control of the respective configurational elements in the SSD 100A. The controller 10A and the NAND memory 20 are connected by a control I/O line (Ctrl I/O) for inputting and outputting commands, addresses, data and the like, and a ready/busy signal (Ry/By) that indicates whether the NAND memory 20 is in a ready state or a busy state is input from the NAND memory 20 to the controller 10A. The controller 10A is a functional configurational element, and for example includes at least a part of at least one of the processor 104 and a controller 113 as shown in FIG. 3.

The controller 10A includes a read/write controlling section 11, a monitoring section 12, a determining section 13, and a notification processing section 15.

The read/write controlling section 11 performs read/write controls of data with the NAND memory 20 by using the cache district of the DRAM 30 based on the managing information stored in the DRAM 30.

The monitoring section 12 monitors changes in the threshold distribution of the plurality of memory cells (plurality of memory cell transistors MCT) upon performing the read processing. This threshold distribution of the plurality of monitored memory cells for example includes a reading number (retry number) until the read processing succeeds in repeatedly performing the read processing (performing retry read processing).

That is, as shown in FIG. 7, the threshold distribution of the plurality of memory cells changes from its distribution in a fresh state shown in solid lines to a distribution after a long period of time has elapsed since its first use shown in dotted lines. In comparing the threshold distribution shown in the dotted lines and levels of read voltages VA, VB, VC, it can be understood that lower voltage side portions of the threshold distribution approach closer to the levels of the read voltages VA, VB, VC than in the fresh state. The threshold distribution shown in the dotted lines is in fact not fixed, and wavers to the lower voltage side as well as a higher voltage side. Thus, as the lower voltage side portions of the threshold distribution approaches closer to the levels of the read voltages VA, VB, VC, the reading number (retry number) until the read processing succeeds in repeatedly performing the read processing (performing the retry read processing) tends to increase. Due to this, by monitoring the change in the reading number, the change in the threshold distribution can be monitored. As shown in FIG. 7, a closeness of the read voltage and the level may vary depending on the data. In FIG. 7, a case in which following formula 1 stands valid is shown as an example.

Reading Number of Data "10"<Reading Number of Data "00"<Reading Number of Data "01"  Formula 1

Further, the phenomenon related to the lowering of the threshold voltages is not limited to the case with the memory cells (MLC: Multi Level Cells) that store data of 2 bits or more (multilevel) as shown in FIG. 7; as shown in FIG. 8, the same applies to the case with memory cells (SLC: Single Level Cells) that store data of 1 bit (two-level). Note that, in the case of the MLCs, due to a restriction regarding a margin among the threshold distribution being severe compared to the case of the SLCs, an influence of the lowering of the threshold voltages is more prominent.

Specifically, the monitoring section 12 includes a reading number monitoring section 121. The reading number monitoring section 121 measures the reading number in repeatedly performing the read processing in the physical block units until the read processing succeeds. For example, if a process called ware leveling in which variation in the number of writing/erasure among blocks is reduced by evenly dispersing data updating sections is being performed in the SSD 100A, the reading number monitoring section 121 measures the reading number every time the read processing is performed for a representative physical page in the physical block that is a measuring target (that is, the plurality of memory cell transistors MCT driven by the selected word line). For example, the reading number monitoring section 121 receives a notification that the read processing has been performed every time the read processing is performed for this representative physical page, and increments a count value of reading number Nw of the representative physical page. The reading number monitoring section 121 supplies the incremented reading number to the determining section 13, and also records it to an entry of a corresponding physical block in the aforementioned reading number managing table.

More specifically, every time the read processing is performed, the reading number monitoring section 121 receives a determination result on whether the read processing succeeded or not for each bit in the representative physical page (each memory cell) from at least one of the first ECC circuit 118 and the second ECC circuit 112.

For example, the reading number monitoring section 121 counts the reading number for each of the plurality of memory cells in the representative physical page, and obtains the reading number for each of the plurality of memory cells.

Alternatively, for example, the reading number monitoring section 121 may obtain the reading number for the representative physical page by statistically processing the reading numbers of the plurality of memory cells. The statistic processing may for example be a simple average, an weighted mean, a selection of a measure of central tendency, a selection of median, and the like. The reading number monitoring section 121 determines the obtained reading number as the reading number of the physical block corresponding to the representative physical page.

The determining section 13 receives a monitoring result by the monitoring section 12. The determining section 13 determines the degree of deterioration of the NAND memory 20 in accordance with the monitoring result from the monitoring section 12. Specifically, the determining section 13 compares the reading number monitored by the monitoring section 12 with a predetermined threshold, and determines the degree of deterioration of each block in the NAND memory 20 according to that comparison result. The determining section 13 supplies a determination result to the notification processing section 15.

For example, the determining section 13 compares the monitored reading numbers with the predetermined threshold in block units. That is, the determining section 13 identifies a distribution of the reading numbers of the plurality of memory cells for the block that is a target of determination from the monitoring result by the monitoring section 12 (see FIG. 9), and specifies a frequency of the reading numbers that is at or more than a number threshold Nth among the distribution of the reading numbers of the plurality of memory cells. The determining section 13 compares the specified frequency with a frequency threshold Fth, and determines whether the life of the block that is the target of determination is nearing an end or not in accordance with that comparison result.

Alternatively, for example, the determining section 13 may compare the monitored reading number with the predetermined threshold in the block units. That is, the determining section 13 may identify the reading number of the block that is the target of determination from the monitoring result by the monitoring section 12, compare the reading number of the block that is the target of determination with the number threshold Nth, and determine whether the life of the block that is the target of determination is nearing the end or not in accordance with that comparison result.

The notification processing section 15 receives the determination result from the determining section 13. The notification processing section 15 notifies the life of the NAND memory 20 in accordance with the determination result by the determining section 13 by using a notification device 21. That is, the notification processing section 15 generates notification information indicating contents to be notified in accordance with the determination result from the determining section 13, and supplies the same to the notification device 21. In response to this, the notification device 21 performs a notification regarding the life of the NAND memory 20 to the user in compliance with the notification information. The notification device 21 corresponds for example to the LED 6, the notification device 9, the notification device 1*a* in FIG. 1, and the like. The notification by the notification device 21 includes for example a notification by turning on or blinking the LED 6, a notification by a display on a screen of the notification device 9 or the notification device 1*a*, a notification by an audio output from a speaker of the notification device 9 or the notification device 1*a*, a notification by a buzzer of the notification device 9 or the notification device 1*a*, and the like.

Figure 9:
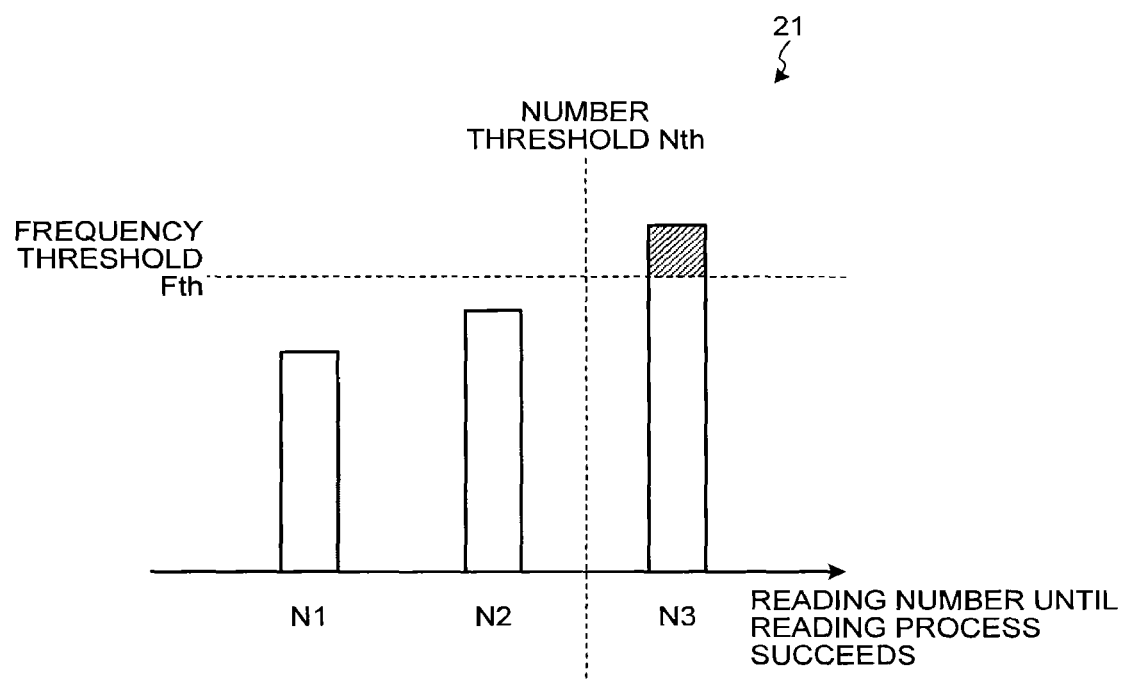
FIG. 9 is a diagram showing contents of notification by a notification processing section according to the first embodiment.

For example, the notification processing section 15 generates notification information including a graph shown in FIG. 9 for each block in the NAND memory 20, supplies the same to the notification device 21, and notifies that graph to the user as the information indicating whether the life is nearing the end or not. That is, the notification device 21 may for example be a display device, and the notification processing section 15 may notify to the user that the lifetime of a block is nearing its end by displaying a bar graph showing the distribution of the reading numbers of the plurality of memory cells and displaying that a portion exceeding the frequency threshold Fth and the number threshold Nth exists in a highlighted display.

Alternatively, for example, the notification processing section 15 may generate notification information including a message indicating whether the life is nearing to its end or not for each block in the NAND memory 20, supply the same to the notification device 21, and notify that message to the user as the information indicating whether the life is nearing its end or not. That is, the notification device 21 may for example be a display device, and the notification processing section 15 may notify to the user that the lifetime of the block is nearing its end by displaying the message indicating that the life is nearing to its end.

Figure 6:
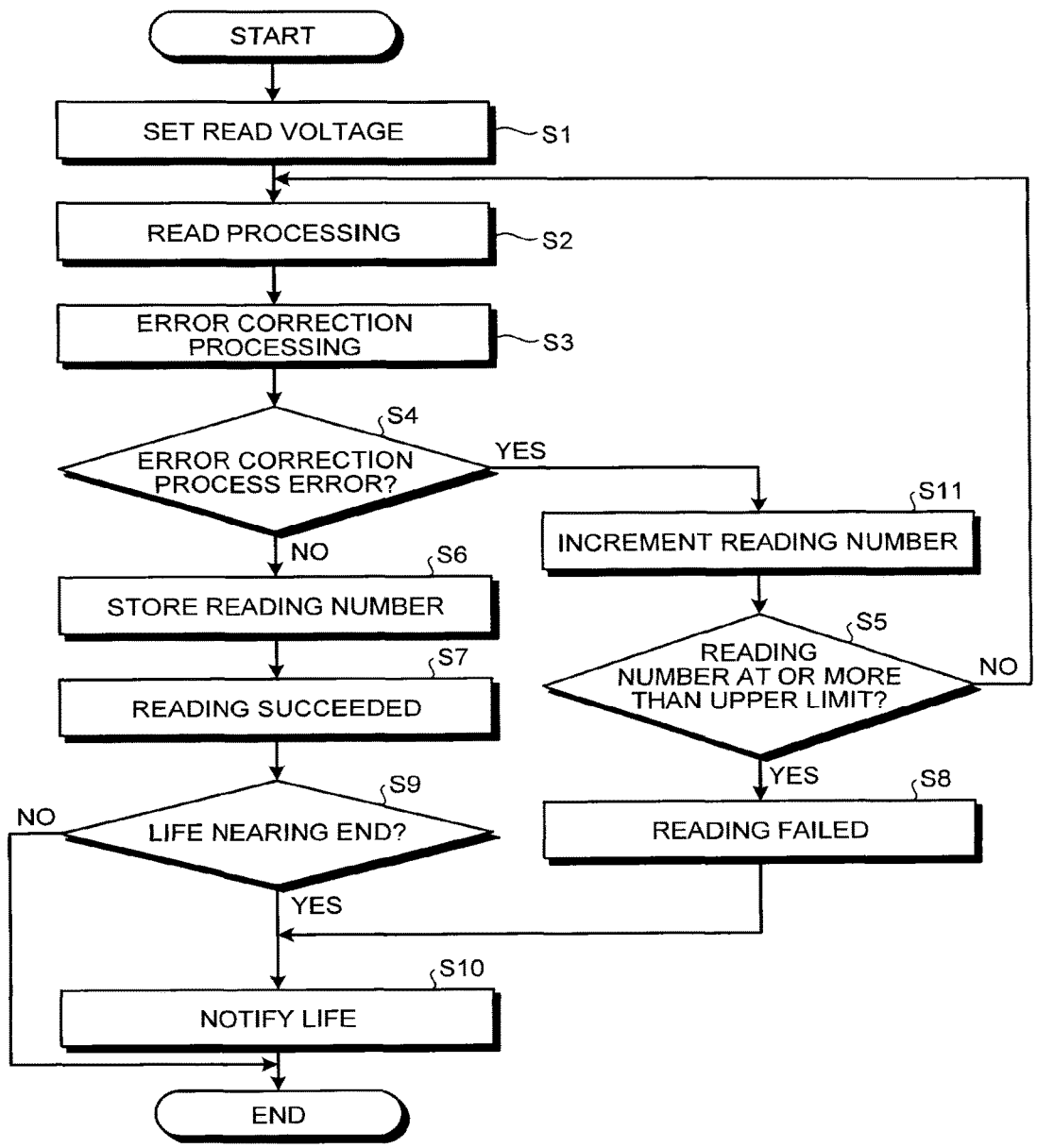
FIG. 6 is a flowchart showing an operation of the non-volatile semiconductor storage device according to the first embodiment.

Next, an operation of the SSD 100A will be explained with reference to FIG. 6. FIG. 6 is a flowchart showing the operation of the SSD 100A.

Upon the read processing, the drive control circuit 4 references the read voltage managing table and sets a read voltage (step S1). Specifically, the drive control circuit 4 searches the read voltage managing table with a read target address as a search key, and obtains the read voltage. If the obtained read voltage is a default value, a normal read command is sent to a read target memory chip. On the other hand, if the obtained read voltage is not the default value, a command to perform the reading with the obtained read voltage (shift read command) is sent to the read target memory chip. Thereafter, the SSD 100 repeatedly performs a loop processing of step S2 to step S5 until the reading succeeds.

In this loop processing, the read target memory chip performs the read processing of data by applying the read voltage designated by the command sent from the drive control circuit 4 to a target word line from the word line control circuit 206 (step S2). The read data is sent to the drive control circuit 4. The drive control circuit 4 performs an error correction processing by using at least one of the second ECC circuit 112 and the first ECC circuit 118 (step S3). Next, the drive control circuit 4 determines whether the error correction failed (error correction process error), that is, whether the error correction by the first ECC circuit 118 and the second ECC circuit 112 failed (step S4).

If the error correction process error is detected (step S4: Yes), the monitoring section 12 of the drive control circuit 4 increments the count value of the reading number (step S11). The determining section 13 of the drive control circuit 4 determines whether the count value of the reading number, that is, a number of times the loop processing of step S2 to step S5 has been performed exceeds an upper limit set in advance or not (step S5). If the number of the loops exceeds the upper limit (step S5: Yes), the read processing is cancelled as the reading having failed (step S8), and proceeds the process to step S10. If the number of the loops does not exceed the upper limit (step S5: No), the drive control circuit 4 returns the process to step S2, and causes the retry read processing to be performed.

In step S4, if the error correction process error is not detected (step S4: No), the monitoring section 12 of the drive control circuit 4 stores the reading number by updating the reading number managing table by the count value of the reading number (step S6), and completes the retry read processing as the reading having succeeded (step S7).

When a notification that the retry read processing is completed is received, the determining section 13 of the drive control circuit 4 performs a determination on whether the life is nearing the end or not for the target block (step S9).

For example, the determining section 13 identifies the distribution of the reading numbers of the plurality of memory cells for the block that is the target of determination from the monitoring result by the monitoring section 12 (see FIG. 9), and specifies the frequency of the reading number that is at or more than the number threshold Nth from among the distribution of the reading numbers of the plurality of memory cells. The determining section 13 compares the specified frequency with the frequency threshold Fth. If the specified frequency is at or more than the frequency threshold Fth, the determining section 13 proceeds the process to step S10 by determining that the life of the block that is the target of determination is nearing the end (step S9: Yes). If the specified frequency is less than the frequency threshold Fth, the determining section 13 ends the process by determining that the life of the block that is the target of determination is not nearing the end (step S9: No).

Alternatively, for example, the determining section 13 may compare the monitored reading number with the predetermined threshold in block units. That is, the determining section 13 may identify the reading number of the block that is the target of determination from the monitoring result by the monitoring section 12, and compare the reading number of the block that is the target of determination with the number threshold Nth. If the reading number of the block that is the target of determination is at or more than the number threshold Nth, the determining section 13 may proceed the process to step S10 by determining that the life of the block that is the target of determination is nearing the end (step S9: Yes). If the reading number of the block that is the target of determination is less than the number threshold Nth, the determining section 13 may end the process by determining that the life of the block that is the target of determination is not nearing the end (step S9: No).

Then, the notification processing section 15 of the drive control circuit 4 receives the determination result from the determining section 13. The notification processing section 15 notifies the life of the NAND memory in accordance with the determination result by the determining section 13 by using the notification device 21 (step S10). That is, the notification processing section generates the notification information indicating the contents to be notified in accordance with the determination result by the determining section 13, and supplies the same to the notification device 21. In response to this, the notification device 21 performs the notification regarding the life of the NAND memory 20 to the user in compliance with the notification information.

For example, the notification processing section 15 generates the notification information including the graph shown in FIG. 9 for each block in the NAND memory 20, supplies the same to the notification device 21, and notifies that graph to the user as the information indicating whether the life is nearing its end or not. That is, the notification device 21 may for example be a display device, and the notification processing section 15 notifies to the user that the lifetime of a block is nearing its end by displaying the bar graph showing the distribution of the reading numbers of the plurality of memory cells and displaying that a portion exceeding the frequency threshold Fth and the number threshold Nth exists in the highlighted display.

Alternatively, for example, the notification processing section 15 may generate the notification information including the message indicating whether the life is nearing to its end or not for each block in the NAND memory 20, supply the same to the notification device 21, and notify that message to the user as the information indicating whether the life is nearing its end or not. That is, the notification device 21 may for example be a display device, and the notification processing section 15 may notify to the user that the lifetime of the block is nearing its end by displaying the message indicating that the life is nearing to its end.

Note that, in the above, a case in which the number threshold Nth used in the determination on whether the life of the block that is the target of determination is nearing the end or not in step S9 is lower than the upper limit used in the determination on whether the reading failed or not in step S5 is explained. In this case, if the process proceeds to step S8 by assuming Yes in step S5, the reading number is naturally at or more than the number threshold Nth, so the process proceeds to step S10 without performing the determination on whether the life is nearing the end or not (step S9).

Alternatively, the number threshold Nth used in the determination on whether the life of the block that is the target of determination is nearing the end or not may be equal to the upper limit used in the determination on whether the reading failed or not in step S5. In this case, since the determination processing in step S5 serves the role of the determination processing of step S9, a process that has been changed by omitting step S9 in FIG. 6 and ending the process after step S7 will be performed.

Further, although the data written in the NAND memory 20 has been explained as having the ECC district for each page, the unit size of the data having the ECC district may be a plurality of pages. In this case, the reading number managing table will have the reading number recorded for every plurality of pages, and the process shown in FIG. 6 regarding the read processing may be performed for each data for the plurality of pages.

The address to be supplied to the word line control circuit 206 includes a block address for identifying a block that is a target of access among the memory cell array 201 as its upper address, and a page address for identifying a word line that is the target of access in the block that is the target of access as its lower address. In the read voltage managing table, the read voltage may be managed for each block address. By configuring as above, a size of the read voltage managing table can be reduced.

Accordingly, in the first embodiment, the monitoring section 12 monitors the change in the threshold distribution of the plurality of memory cells upon performing the read processing to read data from the plurality of memory cells by applying the read voltage to the word lines. The determining section 13 determines the degree of deterioration of each block in the NAND memory 20 in accordance with the monitoring result by the monitoring section 12. The notification processing section 15 notifies the life of the NAND memory 20 in accordance with the determination result by the determining section 13 by using the notification device 21. Due to this, the life of each block in the NAND memory 20 can be predicted, and as the result of the prediction, for example, whether the life is nearing the end or not for each block in the NAND memory can be notified to the user. As a result, since the user can recognize when the life nears the end for each block in the NAND memory 20, the user can for example replace the semiconductor integrated circuit device whose life is nearing to the end. Due to this, an occurrence in an abrupt and unrecognized loss of data that had been stored in the NAND memory 20 can be reduced.

Further, in the first embodiment, the monitoring section 12 monitors the reading number (retry number) until the read processing succeeds in repeatedly performing the read processing (in performing the retry read processing) under the state in which the read voltage is kept constant. Due to this, the change in the threshold distribution of the plurality of memory cells upon performing the read processing can be monitored with a simple process.

Second Embodiment

Next, a non-volatile semiconductor storage device according to a second embodiment will be explained. Hereinbelow, parts different from the first embodiment will mainly be explained.

Figure 10:
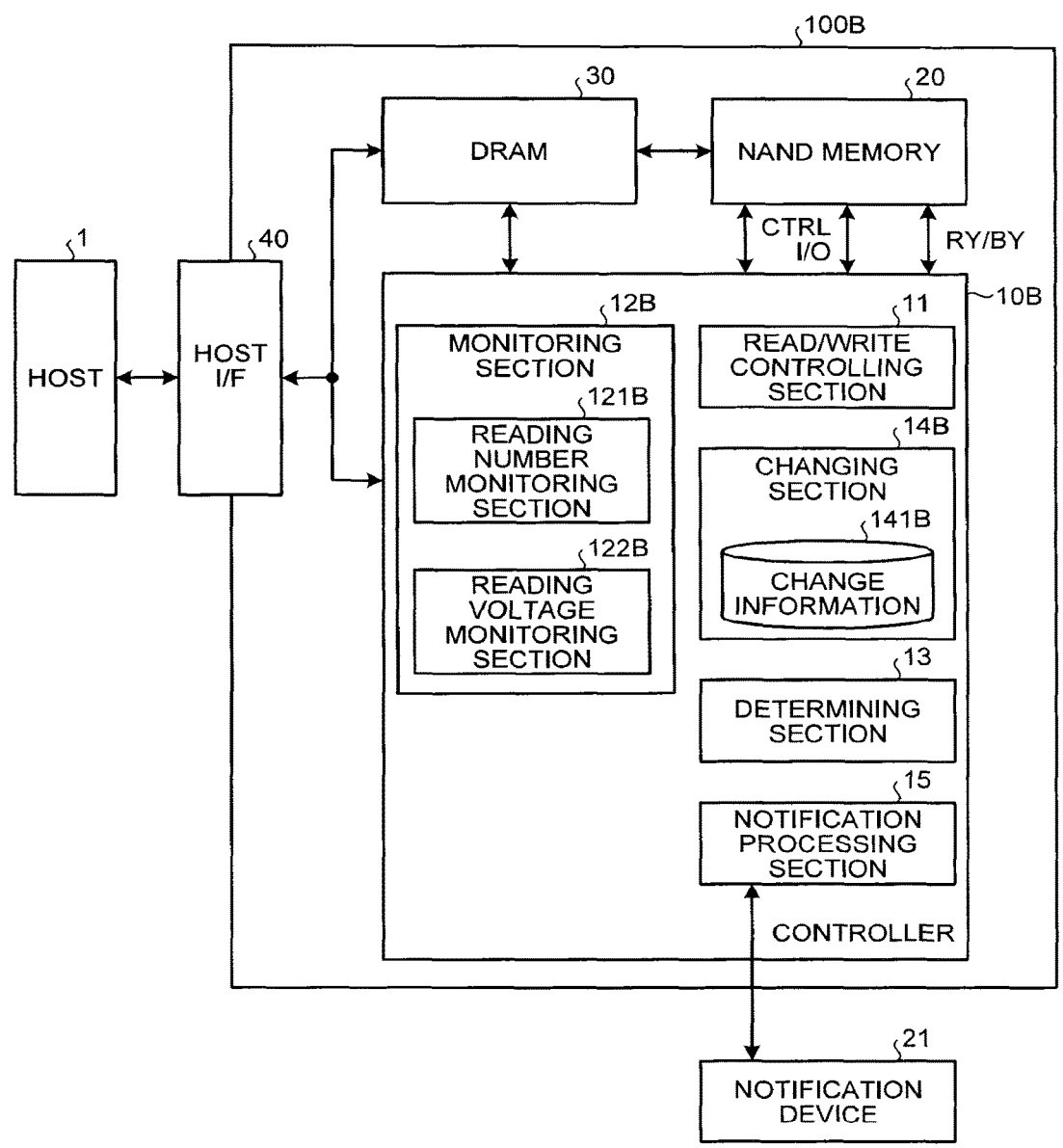
FIG. 10 is a diagram showing a functional configuration of a non-volatile semiconductor storage device according to a second embodiment.

In the first embodiment, the read processing had been repeated (the retry read processing had been performed) under the state in which the read voltage is kept constant. However, in the second embodiment, the read processing will be repeated (the retry shift read processing will be performed) while shifting the read voltage gradually toward one direction. Specifically, as shown in FIG. 10, a controller 10B of an SSD 100B includes a monitoring section 12B and a changing section 14B.

The changing section 14B references change information 141B and changes the read voltage such that the read voltage is gradually shifted to one direction (for example, lowering direction). Specifically, the change information 141B includes a voltage changing amount that should be shifted per one time. The changing section 14B references the change information 141B, and causes the read voltage to shift by the predetermined voltage changing amount each time the read processing is performed. The changing section 14B supplies the read voltage after the change, or a command corresponding to the read voltage after the change to a NAND memory 20.

The monitoring section 12B monitors a change in a threshold distribution of a plurality of memory cells (plurality of memory cell transistors MCT) in performing the read processing by monitoring a reading number until the read processing succeeds in repeatedly performing the read processing while gradually shifting the read voltage (in performing the retry shift read processing). Alternatively, the monitoring section 12B may monitor the change in the threshold distribution of the plurality of memory cells (plurality of memory cell transistors MCT) in performing the read processing by monitoring a read voltage when the read processing succeeded in repeatedly performing the read processing while gradually shifting the read voltage (in performing the retry shift read processing).

Figure 12:
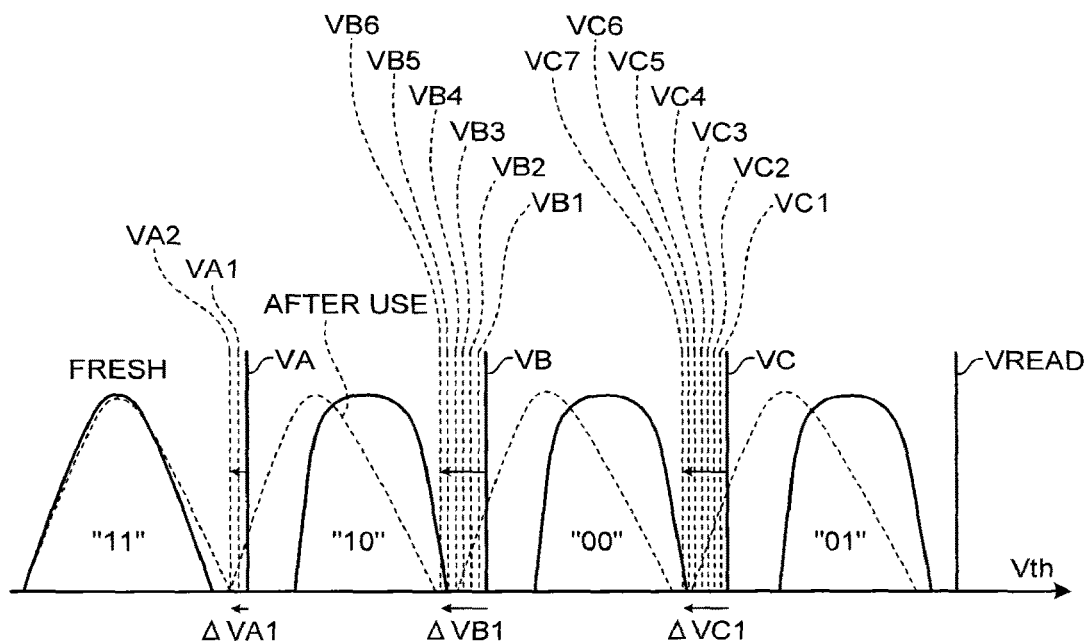
FIG. 12 is a diagram showing a threshold distribution of a plurality of memory cells according to the second embodiment.

That is, as shown in FIG. 12, the threshold distribution of the plurality of memory cells changes from a distribution in a fresh state as shown in solid lines to a distribution after a long period of time has elapsed since its first use shown in dotted lines. When the threshold distribution shown in dotted lines and levels of read voltages VA, VB, VC are compared, since memory cells with lower threshold voltages than the levels of the read voltages VA, VB, VC occur, there may be cases in which data cannot be correctly read by using a default read voltage. Thus, the reading number in performing the retry shift read processing tends to increase as the threshold distribution lowers to a lower voltage side. Thus, by monitoring the change in the reading number of the retry shift read processing, the change in the threshold distribution can be monitored. Alternatively, as the threshold distribution lowers to the lower voltage side, a changing amount of the read voltage from a default value in performing the retry shift read processing may tend to increase. Thus, by monitoring the changing amount of the read voltage from the default value in the retry shift read processing, the change in the threshold distribution can be monitored.

As shown in FIG. 12, a degree of decrease in the threshold distribution may differ among data. For example, for data "10", the read voltage is gradually shifted from VA to VA1 and then VA2, and the reading succeeds with the read voltage VA2. The reading number of the data "10" is for example 2. For example, for data "00", the read voltage is gradually shifted from VB to VB1 through VB6, and the reading succeeds with the read voltage VB6. The reading number of the data "00" is for example 6. For example, for data "01", the read voltage is gradually shifted from VC to VC1 through VC7, and the reading succeeds with the read voltage VC7. The reading number of the data "01" is for example 7. That is, in FIG. 12, an example is given for a case in which the following formula 2 stands valid.

Reading Number of Data "10"<Reading Number of Data "00"<Reading Number of Data "01"    Formula 2

Alternatively, a changing amount of the read voltage with which the reading of the data "10" had succeeded from a default value is $\Delta VA1$. A changing amount of the read voltage with which the reading of the data "00" had succeeded from the default value is $\Delta VB1$ ($>\Delta VA1$). A changing amount of the read voltage with which the reading of the data "01" had succeeded from the default value is $\Delta VC1$ ($>\Delta VB1$). That is, in FIG. 12, an example is given for a case in which the following formula 3 stands valid.

Changing Amount $\Delta VA1$ of Read Voltage of Data "10"<Changing Amount $\Delta VB1$ of Read Voltage of Data "00"<Changing Amount $\Delta VC1$ of Read Voltage of Data "01"    Formula 3

Figure 13:
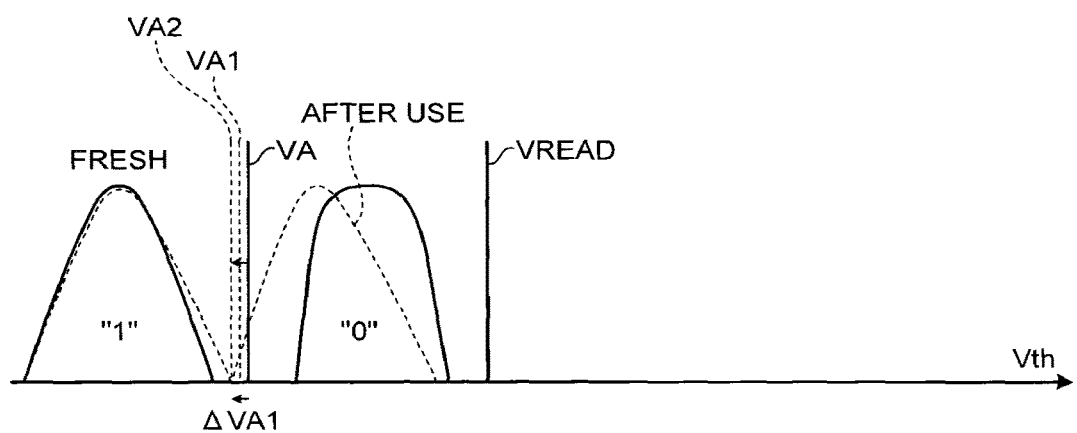
FIG. 13 is a diagram showing the threshold distribution of the plurality of memory cells according to the second embodiment.

Further, the phenomenon related to the lowering of the threshold voltage is not limited to the case of the memory cells (MLCs: Multi Level Cells) storing data of 2 bits or more (multilevel) as shown in FIG. 12; it applies similarly to memory cells (SLCs: Single Level Cells) storing data of 1 bit (two-level) as shown in FIG. 13.

Specifically, the monitoring section 12B includes a reading number monitoring section 121B or a read voltage monitoring section 122B.

The reading number monitoring section 121B measures the reading number until the read processing succeeds in repeatedly performing the read processing in the block units. For example, in a case where a process called wear leveling that reduces a variety in number of writing/erasure among the blocks by evenly dispersing data updating sections is being performed in the SSD 100B, the reading number monitoring section 121B measures the reading number for each read processing from a representative physical page in a physical block that is the measuring target (that is, a plurality of memory cell transistors MCT driven by the selected word line). The reading number monitoring section 121B supplies the measured result to the determining section 13 as the monitoring result.

The reading number monitoring section 121B measures the read voltage when the read processing succeeds in repeatedly performing the read processing in the block units. For example, in the case where the process called the wear leveling that reduces the variety in the number of writing/erasure among the blocks by evenly dispersing the data updating sections is being performed in the SSD 100B, the reading number monitoring section 121B measures the read voltage for each read processing from the representative physical page in the physical block that is the measuring target (that is, the plurality of memory cell transistors MCT driven by the selected word line). Then, the reading number monitoring section 121B calculates the changing amount of the measured read voltage from the default value, and supplies the same to the determining section 13 as the monitoring result.

Figure 11:
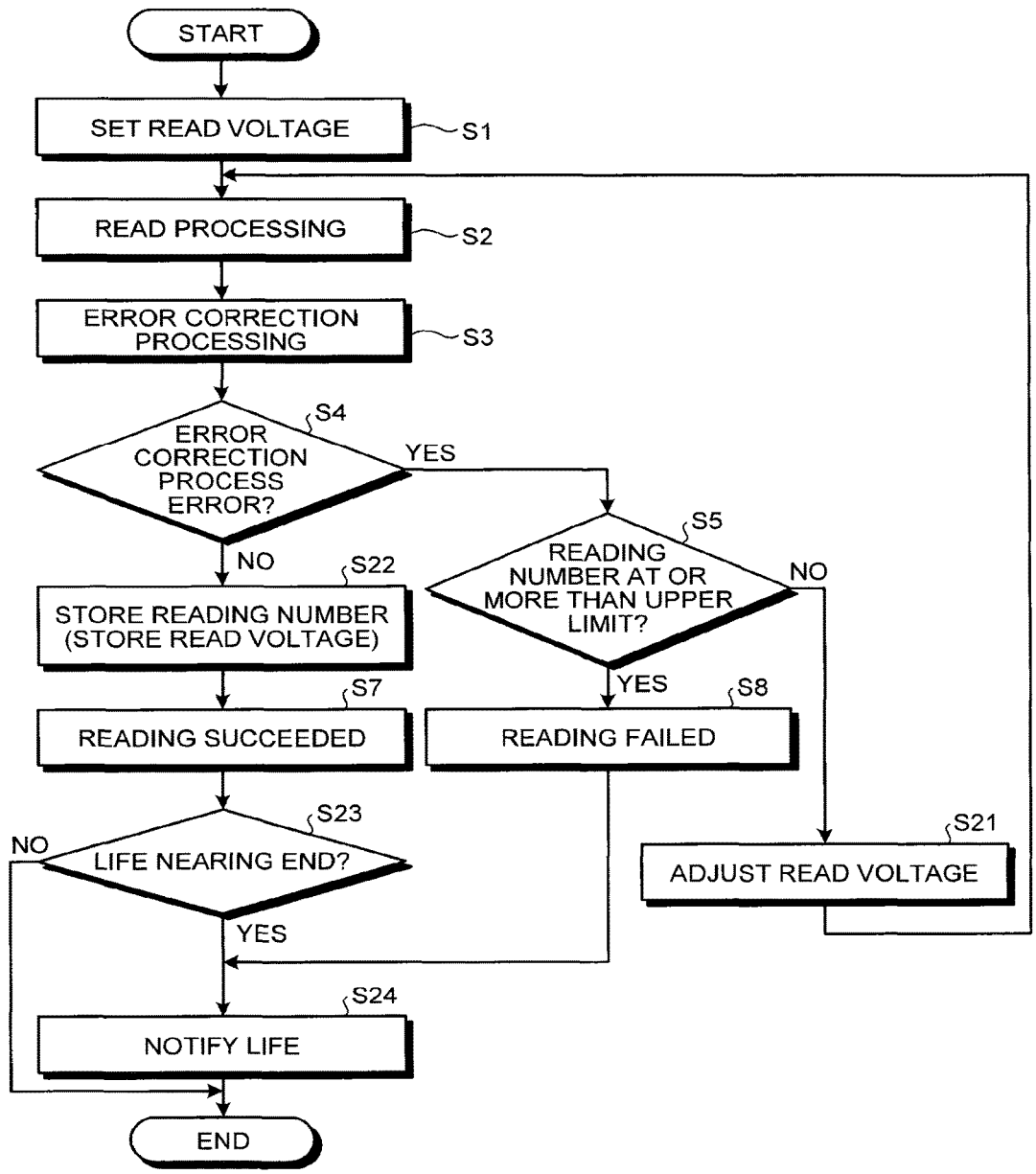
FIG. 11 is a flowchart showing an operation of the non-volatile semiconductor storage device according to the second embodiment.

Further, as shown in FIG. 11, an operation of the SSD 100B differs from the first embodiment in the following points.

As a result of the determination in step S5, if the number of the loops has not exceeded the upper limit (step S5: No), the changing section 14B of the drive control circuit 4 performs an adjustment to lower the value of the read voltage from the value used in step S2 by a predetermined step width (step S21). This is because the threshold voltage has a tendency to lower as the time passes. The value of the read voltage after the adjustment is sent to the memory chip (NAND memory 20) together with a shift read command, and the memory chip transitions to the process of step S2 and performs the read processing by using the read voltage that has been newly sent.

In step S4, if the error correction process error is not detected (step S4: No), the monitoring section 12B of the drive control circuit 4 updates the reading number managing table by the count value of the reading number and stores the reading number, and updates the read voltage managing table with the used read voltage (step 22).

Alternatively, the monitoring section 12B of the drive control circuit 4 may update the read voltage changing amount managing table by the changing amount of the read voltage when the read processing succeeded, store the changing amount of the read voltage, and update the read voltage managing table with the used read voltage (step 22). Note that, the read voltage changing amount managing table is a table for managing the changing amount of the read voltage when the read processing succeeded in block units (physical block address units); and as the changing amount of the read voltage, the changing amount of the latest read voltage that had actually been monitored is recorded. The read voltage changing amount managing table is for example stored in the NAND memory 20.

When a notification regarding that the retry shift read processing is completed is received, the determining section 13 of the drive control circuit 4 determines whether the life of the target block is nearing the end or not (step S23).

For example, the determining section 13 identifies the distribution of the reading numbers of the plurality of memory cells for the block that is the target of determination from the monitoring result by the monitoring section 12B (see FIG. 9), and specifies the frequency of the reading number that is at or more than the number threshold Nth from among the distribution of the reading numbers of the plurality of memory cells. The determining section 13 compares the specified frequency with the frequency threshold Fth. If the specified frequency is at or more than the frequency threshold Fth, the determining section 13 proceeds the process to step S24 by determining that the life of the block that is the target of determination is nearing the end (step S23: Yes). If the specified frequency is less than the frequency threshold Fth, the determining section 13 ends the process by determining that the life of the block that is the target of determination is not nearing the end (step S23: No).

Alternatively, for example, the determining section 13 may compare the monitored reading number of the block that is the target of determination with a predetermined threshold in block units. That is, the determining section 13 may identify the reading number of the block that is the target of determination from the monitoring result by the monitoring section 12B, and compare the reading number of the block that is the target of determination with the number threshold Nth. If the reading number of the block that is the target of determination is at or more than the number threshold Nth, the determining section 13 proceeds the process to step S24 by determining that the life of the block that is the target of determination is nearing the end (step S23: Yes). If the reading number of the block that is the target of determination is less than the number threshold Nth, the determining section 13 ends the process by determining that the life of the block that is the target of determination is not nearing the end (step S23: No).

Alternatively, for example, the determining section 13 identifies the distribution of the changing amounts of the read voltage of the plurality of memory cells for the block that is the target of determination from the monitoring result by the monitoring section 12B (see FIG. 14), and specifies a frequency of the changing amounts of the read voltage that is at or more than a changing amount threshold $\Delta$Vread-th from among the distribution of the changing amounts of the read voltage of the plurality of memory cells. The determining section 13 compares the specified frequency with the frequency threshold Fth. If the specified frequency is at or more than the frequency threshold Fth, the determining section 13 proceeds the process to step S24 by determining that the life of the block that is the target of determination is nearing the end (step S23: Yes). If the specified frequency is less than the frequency threshold Fth, the determining section 13 ends the process by determining that the life of the block that is the target of determination is not nearing the end (step S23: No).

Alternatively, for example, the determining section 13 may compare the changing amount of the read voltage of the block that is the target of determination with a predetermined threshold in the block units. That is, the determining section 13 may identify the changing amount of the read voltage of the block that is the target of determination from the monitoring result by the monitoring section 12B, and compare the changing amount of the read voltage of the block that is the target of determination with the change amount threshold $\Delta$Vread-th. If the changing amount of the read voltage of the block that is the target of determination is at or more than the change amount threshold $\Delta$Vread-th, the determining section 13 proceeds the process to step S24 by determining that the life of the block that is the target of determination is nearing the end (step S23: Yes). If the changing amount of the read voltage of the block that is the target of determination is less than the change amount threshold $\Delta$Vread-th, the determining section 13 ends the process by determining that the life of the block that is the target of determination is not nearing the end (step S23: No).

The notification processing section 15 of the drive control circuit 4 receives the determination result from the determining section 13. The notification processing section 15 notifies the life of the NAND memory 20 in accordance with the determination result by the determining section 13 by using the notification device 21 (step S23). That is, the notification processing section 15 generates notification information indicating contents to be notified in accordance with the determination result by the determining section 13, and supplies the same to the notification device 21. In response to this, the notification device 21 performs the notification regarding the life of the NAND memory 20 to the user in compliance with the notification information.

For example, the notification processing section 15 generates notification information including a graph shown in FIG. 9 for each block in the NAND memory 20, and notifies that graph to the user as the information indicating whether the life is nearing its end or not. That is, the notification device 21 may for example be a display device, and the notification processing section 15 notifies to the user that the lifetime of a block is nearing its end by displaying a bar graph showing the distribution of the reading numbers of the plurality of memory cells and displaying that a portion exceeding the frequency threshold Fth and the number threshold Nth exists in a highlighted display.

Figure 14:
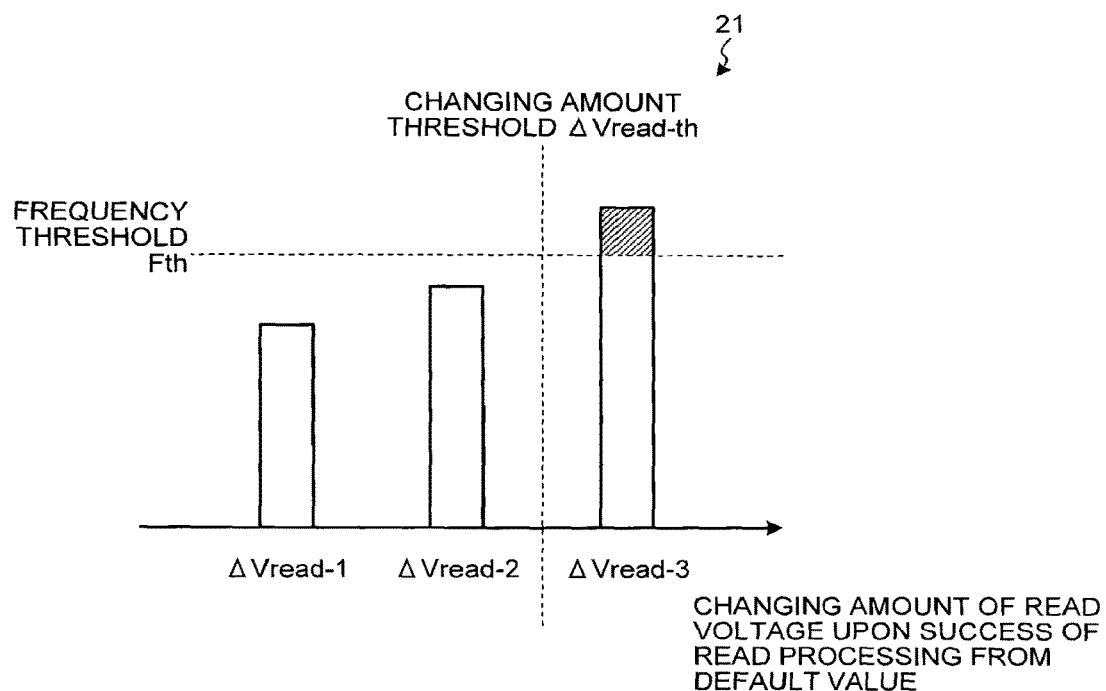
FIG. 14 is a diagram showing contents of notification by a notification processing section according to the second embodiment.

Alternatively, for example, the notification processing section 15 may generate notification information including a graph shown in FIG. 14 for each block in the NAND memory 20, supply the same to the notification device 21, and notify that graph to the user as the information indicating whether the life is nearing its end or not. That is, the notification device 21 may for example be a display device, and the notification processing section 15 may notify to the user that the lifetime of a block is nearing its end by displaying a bar graph showing the distribution of the changing amounts of the read voltage of the plurality of memory cells and displaying that a portion exceeding the frequency threshold Fth and the change amount threshold ΔVread-th exists in a highlighted display.

Alternatively, for example, the notification processing section 15 may generate the notification information including a message indicating whether the life is nearing to its end or not for each block in the NAND memory 20, supply the same to the notification device 21, and notify that message to the user as the information indicating whether the life is nearing its end or not. That is, the notification device 21 may for example be a display device, and the notification processing section 15 may notify to the user that the lifetime of the block is nearing its end by displaying the message indicating that the life is nearing to its end.

According to the above, in the second embodiment, the monitoring section 12B monitors the reading number (retry number) until the read processing succeeds in repeatedly performing the read processing (performing the retry shift read processing) while gradually shifting the read voltage to one direction. Due to this, the change in the threshold distribution of the plurality of memory cells upon performing the read processing can be monitored with a simple process.

Alternatively, the monitoring section 12B may monitor the read voltage when the read processing succeeds in repeatedly performing the read processing (performing the retry shift read processing) while gradually shifting the read voltage to one direction. Due to this, the change in the threshold distribution of the plurality of memory cells upon performing the read processing can be monitored with a simple process.

Third Embodiment

Next, a non-volatile semiconductor storage device according to a third embodiment will be explained. Hereinbelow, parts different from the first embodiment will mainly be explained.

Figure 15:
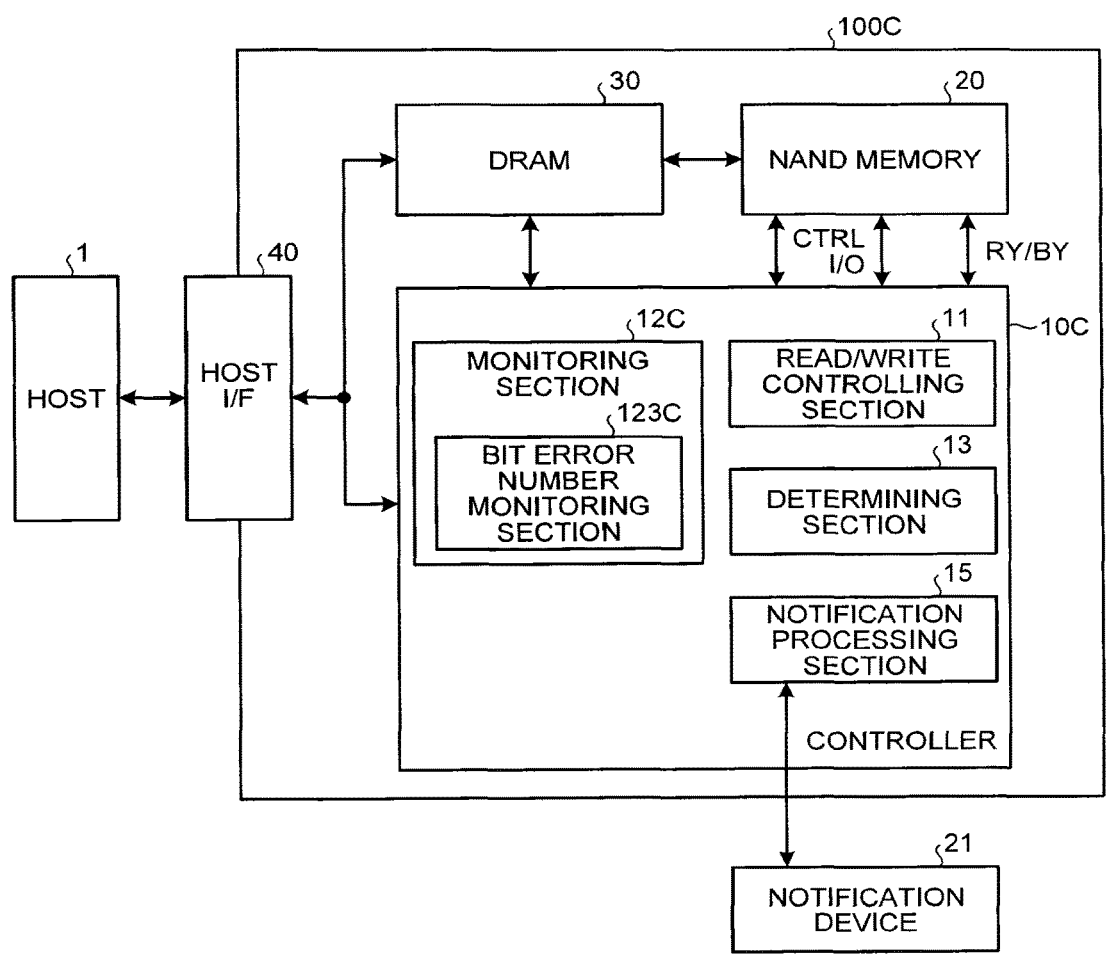
FIG. 15 is a diagram showing a functional configuration of a non-volatile semiconductor storage device according to a third embodiment.

In the first embodiment, the reading number in repeatedly performing the read processing had been monitored, however, in the third embodiment, a bit error number upon performing the read processing is monitored. Specifically, as shown in FIG. 15, a controller 10C of an SSD 100C includes a monitoring section 12C.

The monitoring section 12C monitors the change in the threshold distribution of the plurality of memory cells (plurality of memory cell transistors MCT) in performing the read processing by monitoring the bit error number in the data of the plurality of memory cells in performing the read processing.

That is, as shown in FIG. 12, the threshold distribution of the plurality of memory cells changes from a distribution in a fresh state as shown in solid lines to a distribution after a long period of time has elapsed since its first use shown in dotted lines. When the threshold distribution shown in dotted lines and levels of read voltages VA, VB, VC are compared, since memory cells with lower threshold voltages than the levels of the read voltages VA, VB, VC occur, there may be cases in which data cannot be correctly read by using a default read voltage. Here, as the threshold distribution lowers to the lower voltage side, the bit error number (a corrected bit number in the ECC) in the data of the plurality of memory cells in performing the read processing tends to increase. Due to this, by monitoring the bit error number, the change in the threshold distribution can be monitored.

Specifically, the monitoring section 12C includes a bit error number monitoring section 123C. The bit error number monitoring section 123C measures the bit error number by obtaining information of the bit error number in performing the read processing from at least one of a first ECC circuit 118 and a second ECC circuit 112 in the physical block units. For example, in a case where the process called the wear leveling that reduces the variety in the number of writing/erasure among blocks by evenly dispersing the data updating sections is being performed in the SSD 100C, the bit error number monitoring section 123C measures the bit error number for each read processing from a representative physical page in a physical block that is a measuring target (that is, a plurality of memory cell transistors MCT driven by the selected word line). The bit error number monitoring section 123C supplies a measured result to a determining section 13 as the monitoring result.

Figure 16:
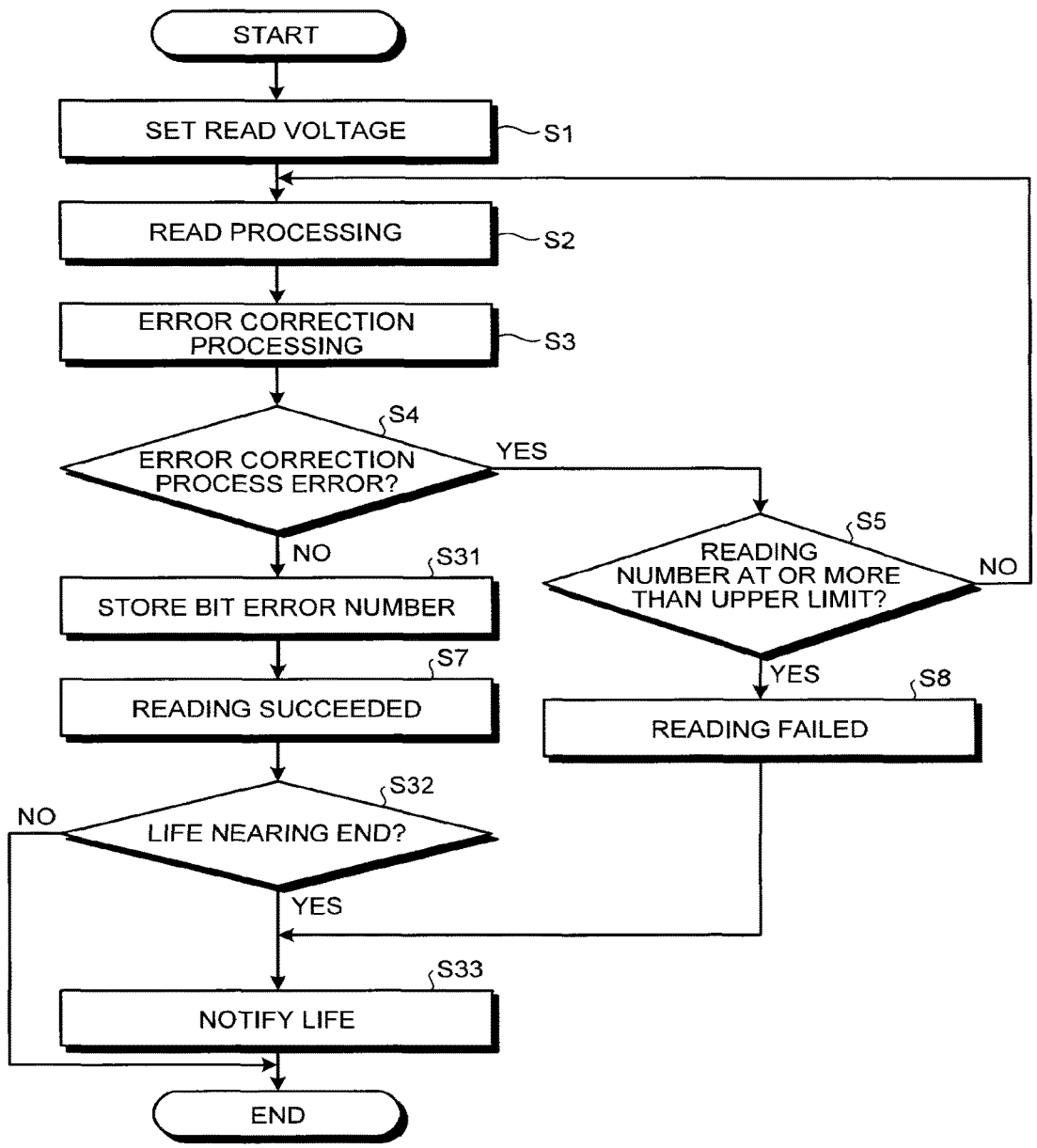
FIG. 16 is a flowchart showing an operation of the non-volatile semiconductor storage device according to the third embodiment.

Further, as shown in FIG. 16, an operation of the SSD 100C differs from the first embodiment in the following points.

In step S4, if the error correction process error is not detected (step S4: No), the monitoring section 12C of the drive control circuit 4 stores the bit error number by updating a bit error number managing table by a count value of the bit error number (step 31). Note that, the bit error number managing table is a table for managing the bit error number in the physical block units (physical block address units); and as the bit error number, the latest bit error number that had actually been monitored is recorded. The bit error number managing table is for example stored in a NAND memory 20.

When a notification regarding that for example a retry shift read processing is completed is received, the determining section 13 of the drive control circuit 4 determines whether a life of a target block is nearing an end or not (step S32).

For example, the determining section 13 identifies a distribution of the bit error numbers of the plurality of memory cells for the block that is the target of determination from the monitoring result by the monitoring section 12 (see FIG. 17), and specifies a frequency of the bit error number that is at or more than a bit error number threshold BNth from among the distribution of the bit error numbers of the plurality of memory cells. The determining section 13 compares the specified frequency with the frequency threshold Fth. If the specified frequency is at or more than the frequency threshold Fth, the determining section 13 proceeds the process to step S33 by determining that the life of the block that is the target of determination is nearing the end (step S32: Yes). If the specified frequency is less than the frequency threshold Fth, the determining section 13 ends the process by determining that the life of the block that is the target of determination is not nearing the end (step S32: No).

Alternatively, for example, the determining section 13 may compare the monitored bit error number of the block that is the target of determination with a predetermined threshold in block units. That is, the determining section 13 may identify the bit error number of the block that is the target of determination from the monitoring result by the monitoring section 12C, and compare the bit error number of the block that is the target of determination with the bit error number threshold BNth. If the bit error number of the block that is the target of determination is at or more than the bit error number threshold BNth, the determining section 13 proceeds the process to step S33 by determining that the life of the block that is the target of determination is nearing the end (step S32: Yes). If the bit error number of the block that is the target of determination is less than the bit error number threshold BNth, the determining section 13 ends the process by determining that the life of the block that is the target of determination is not nearing the end (step S32: No).

The notification processing section 15 of the drive control circuit 4 receives the determination result from the determining section 13. The notification processing section 15 notifies the life of the NAND memory 20 in accordance with the determination result by the determining section 13 by using the notification device 21 (step S33). That is, the notification processing section 15 generates notification information indicating contents to be notified in accordance with the determination result by the determining section 13, and supplies the same to the notification device 21. In response to this, the notification device 21 performs notification regarding the life of the NAND memory 20 to the user in compliance with the notification information.

Figure 17:
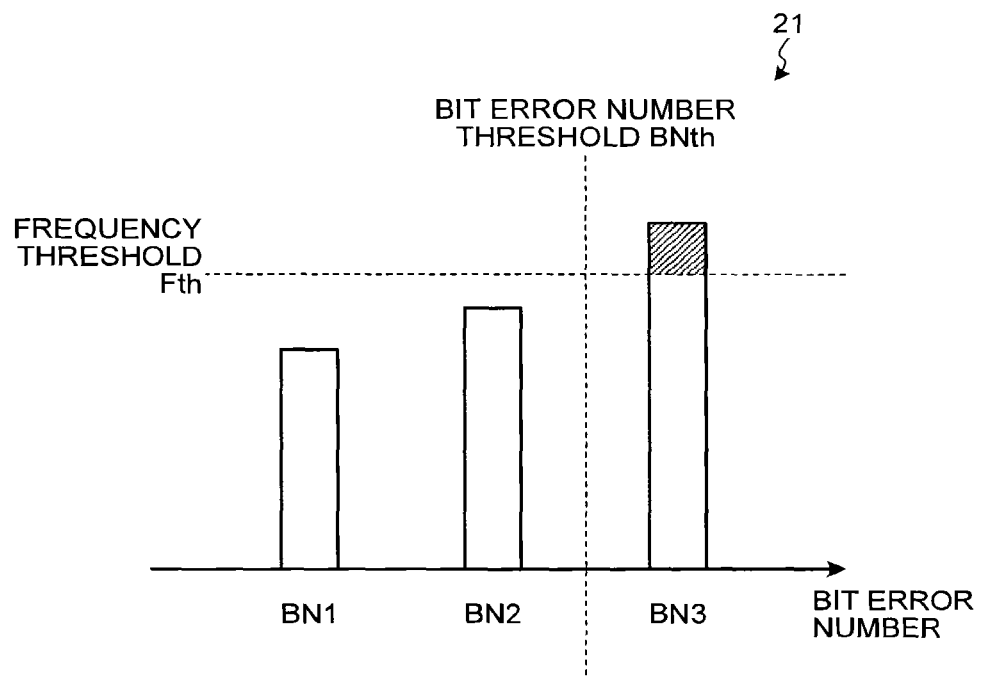
FIG. 17 is a diagram showing contents of notification by a notification processing section according to the third embodiment.

For example, the notification processing section 15 generates notification information including a graph shown in FIG. 17 for each block in the NAND memory 20, and notifies that graph to the user as the information indicating whether the life is nearing its end or not. That is, the notification device 21 may for example be a display device, and the notification processing section 15 may notify to the user that the lifetime of a block is nearing its end by displaying a bar graph showing the distribution of the bit error numbers of the plurality of memory cells and displaying that a portion exceeding the frequency threshold Fth and the bit error number threshold BNth exists in a highlighted display.

Alternatively, for example, the notification processing section 15 may generate notification information including a message indicating whether the life is nearing to its end or not for each block in the NAND memory 20, supply the same to the notification device 21, and notify that message to the user as the information indicating whether the life is nearing its end or not. That is, the notification device 21 may for example be a display device, and the notification processing section 15 may notify to the user that the lifetime of the block is nearing its end by displaying the message indicating that the life is nearing to its end.

According to the above, in the third embodiment, the monitoring section 12C monitors the bit error number in the data of the plurality of memory cells in performing the read processing. Due to this, the change in the threshold distribution of the plurality of memory cells upon performing the read processing can be monitored with a simple process.

Fourth Embodiment

Next, a non-volatile semiconductor storage device according to a fourth embodiment will be explained. Hereinbelow, parts different from the second embodiment will mainly be explained.

In the second embodiment, the read processing had been repeated while shifting the read voltage gradually toward one direction until the read processing succeeds, however, in cases where the read processing succeeds without having to shift the read voltage, there is no knowing as to how much allowability is left before an error correction process error arises.

Figure 18:
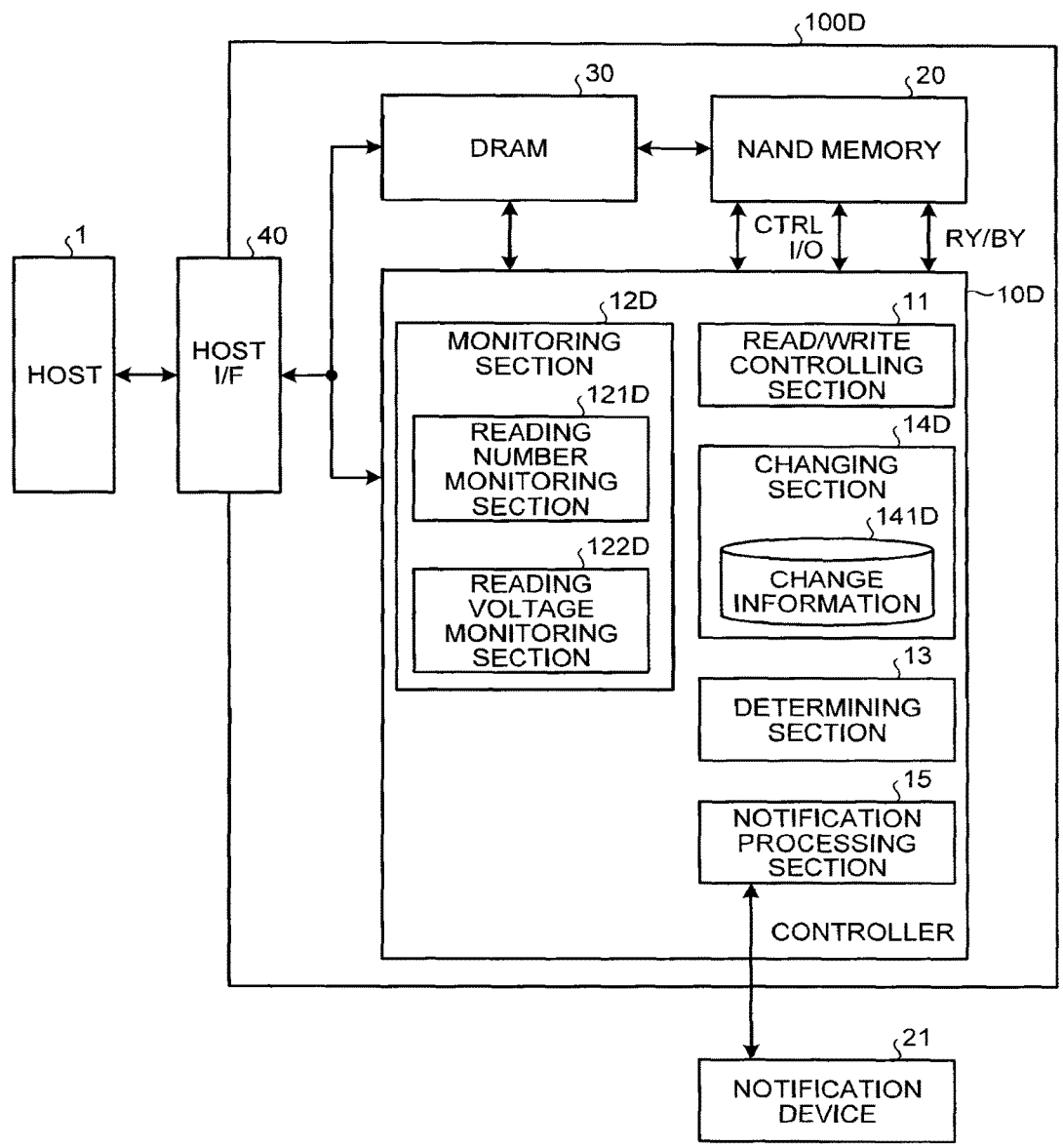
FIG. 18 is a diagram showing a functional configuration of a non-volatile semiconductor storage device according to a fourth embodiment.

Thus, in the fourth embodiment, by repeatedly performing the read processing while gradually shifting the read voltage respectively toward a rising direction and a lowering direction until the read processing fails, the allowability that is left before the error correction process error arises is grasped. Specifically, as shown in FIG. 18, a controller 10D of an SSD 100D includes a monitoring section 12D and a changing section 14D.

The changing section 14D references change information 141D, and changes the read voltage so as to gradually shift respectively to the rising direction and the lowering direction. Specifically, the change information 141D includes a voltage changing amount to be shifted each time in the rising direction, and a voltage changing amount to be shifted each time in the lowering direction. By referencing the change information 141D, the changing section 14D shifts the read voltage by the predetermined voltage changing amount respectively in the rising direction and the lowering direction each time the read processing is performed. The changing section 14D supplies the read voltage after the change, or a command corresponding to the read voltage after the change to a NAND memory 20.

A reading number monitoring section 121D of the monitoring section 12D monitors the change in the threshold distribution as to how much allowability is left in the current threshold distribution before the error correction process error arises by monitoring the reading number until the read processing fails in repeatedly performing the read processing while gradually shifting the read voltage. Or on the other hand, a read voltage monitoring section 122D of the monitoring section 12D monitors the change in the threshold distribution as to how much allowability is left in the current threshold distribution before the error correction process error arises by monitoring the read voltage when the read processing fails in repeatedly performing the read processing while gradually shifting the read voltage.

Figure 20:
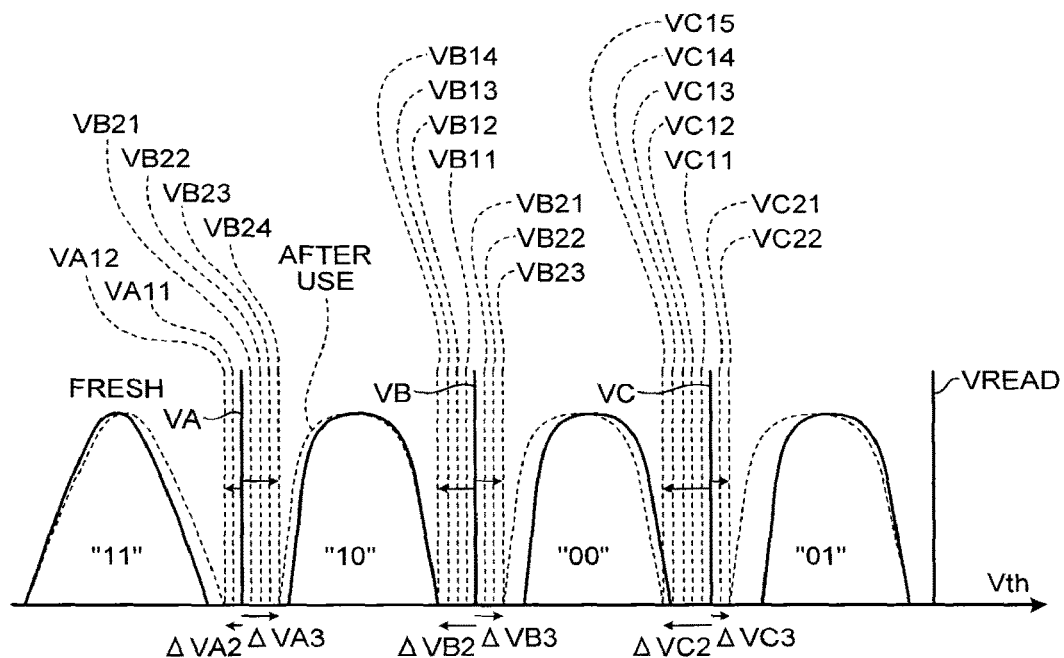
FIG. 20 is a diagram showing a threshold distribution of a plurality of memory cells according to the fourth embodiment.

That is, as shown in FIG. 20, the threshold distribution of the plurality of memory cells changes from its distribution in a fresh state shown in solid lines to a distribution after a long period of time has elapsed since its first use shown in dotted lines. In comparing the threshold distribution shown in the dotted lines and levels of read voltages VA, VB, VC, it can be understood that lower voltage side portions of the threshold distribution approach closer to the levels of the read voltages VA, VB, VC than in the fresh state, but enough space is still present between them. Here, a condition of the allowability of the read voltage in the rising direction (+ direction) accompanying the change in the threshold distribution can be monitored by monitoring the reading number until the reading fails or the read voltage when the reading fails in repeatedly performing the read processing while gradually shifting the read voltage to the rising direction (+ direction).

As shown in FIG. 20, the condition of the allowability of the read voltage in the rising direction (+ direction) accompanying the change in the threshold distribution may differ depending on the data. For example, for data "10", the read voltage may gradually shift from VA to VA21 trough VA24, and the reading may fail at the read voltage VA24. The reading number for the data "10" until the reading fails is for example 4. For example, for data "00", the read voltage may gradually shift from VB to VB21 through VB23, and the reading may fail at the read voltage VB23. The reading number for the data "00" until the reading fails is for example 3. For example, for data "01", the read voltage may gradually shift from VC to VC21 and then VC22, and the reading may fail at the read voltage VC22. The reading number for the data "01" until the reading fails is for example 2. That is, in FIG. 20, an example is given for a case in which the following formula 4 stands valid.

Reading Number of Data "10">Reading Number of Data "00">Reading Number of Data "01"   Formula 4

Alternatively, a changing amount of the read voltage with which the reading of the data "10" had failed from a default value is ΔVA3. A changing amount of the read voltage with which the reading of the data "00" had failed from the default value is ΔVB3 (<ΔVA3). A changing amount of the read voltage with which the reading of the data "01" had failed from the default value is ΔVC3 (<ΔVB3). That is, in FIG. 20, an example is given for a case in which the following formula 5 stands valid.

Changing Amount ΔVA3 of Read Voltage of Data "10">Changing Amount ΔVB3 of Read Voltage of Data "00">Changing Amount ΔVC3 of Read Voltage of Data "01"   Formula 5

Figure 21:
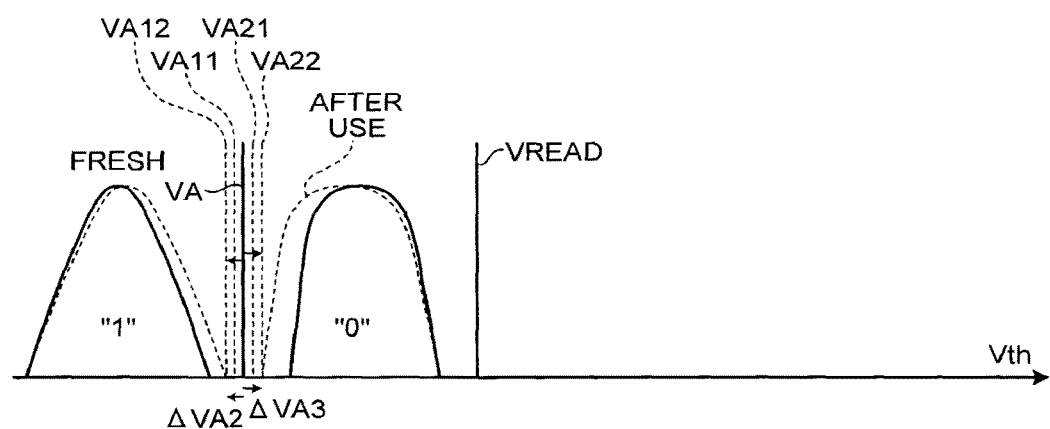
FIG. 21 is a diagram showing the threshold distribution of the plurality of memory cells according to the fourth embodiment.

Further, a phenomenon related to the condition of the allowability of the read voltage in the rising direction is not limited to the case of the memory cells (MLCs: Multi Level Cells) storing data of 2 bits or more (multilevel) as shown in FIG. 20; it applies similarly to memory cells (SLCs: Single Level Cells) storing data of 1 bit (two-level) as shown in FIG. 21.

Further, a size of the memory cells in the NAND type flash memory is refined, and a number of electrons stored in a memory cell is reduced. Due to this, an influence of interference noises between adjacent cells is relatively increased, and a possibility is known that when data writing (programming) and reading are performed to one memory cell, data in another memory cell adjacent thereto may change. For example, the data writing is performed to the memory cell that is selected by the word line and the bit line. However, by a strong stress on unwritten cells by the selected cell, the unselected cells also assume a state of lightly being written, and a phenomenon of a program disturb (PD) in which the threshold voltage changes to higher states may occur. Further, in the data reading also, voltage is applied to the unselected cells. Due to this, the unselected memory cells also assume the state of lightly being written, and a phenomenon of a read disturb (RD) in which change takes place to raise the threshold voltage occurs. That is, it can be understood that higher voltage side portions of the threshold distribution may approach closer to the levels of the read voltages VA, VB, VC, but enough space is still present between them. Here, a condition of allowability of the read voltage in the lowering direction (− direction) accompanying the change in the threshold distribution can be monitored by monitoring the reading number in repeatedly performing the read processing while gradually shifting the read voltage to the lowering direction (− direction).

As shown in FIG. 20, the condition of the allowability of the read voltage in the lowering direction (− direction) accompanying the change in the threshold distribution may differ depending on the data. For example, for data "11", the read voltage may gradually shift from VA to VA11 and then VA12, and the reading may fail at the read voltage VA12. The reading number for the data "11" until the reading fails is for example 2. For example, for data "10", the read voltage may gradually shift from VB to VB11 through VB14, and the reading may fail at the read voltage VB14. The reading number for the data "10" until the reading fails is for example 4. For example, for data "00", the read voltage may gradually shift from VC to VC11 through VC15, and the reading may fail at the read voltage VC15. The reading number for the data "00" until the reading fails is for example 5. That is, in FIG. 20, an example is given for a case in which the following formula 6 stands valid.

Reading Number of Data "11"<Reading Number of Data "10"<Reading Number of Data "00"   Formula 6

Alternatively, a changing amount of the read voltage with which the reading of the data "11" had failed from a default value is ΔVA2. A changing amount of the read voltage with which the reading of the data "10" had failed from the default value is ΔVB2 (>ΔVA2). A changing amount of the read voltage with which the reading of the data "00" had failed from the default value is ΔVC2 (>ΔVB2). That is, in FIG. 20, an example is given for a case in which the following formula 7 stands valid.

Changing Amount ΔVA2 of Read Voltage of Data "10">Changing Amount ΔVB2 of Read Voltage of Data "00">Changing Amount ΔVC2 of Read Voltage of Data "01"   Formula 7

Further, the phenomenon related to the condition of the allowability of the read voltage in the lowering direction is not limited to the case of the memory cells (MLCs: Multi Level Cells) storing data of 2 bits or more (multilevel) as shown in FIG. 20; it applies similarly to the memory cells (SLCs: Single Level Cells) storing data of 1 bit (two-level) as shown in FIG. 21.

Figure 19:
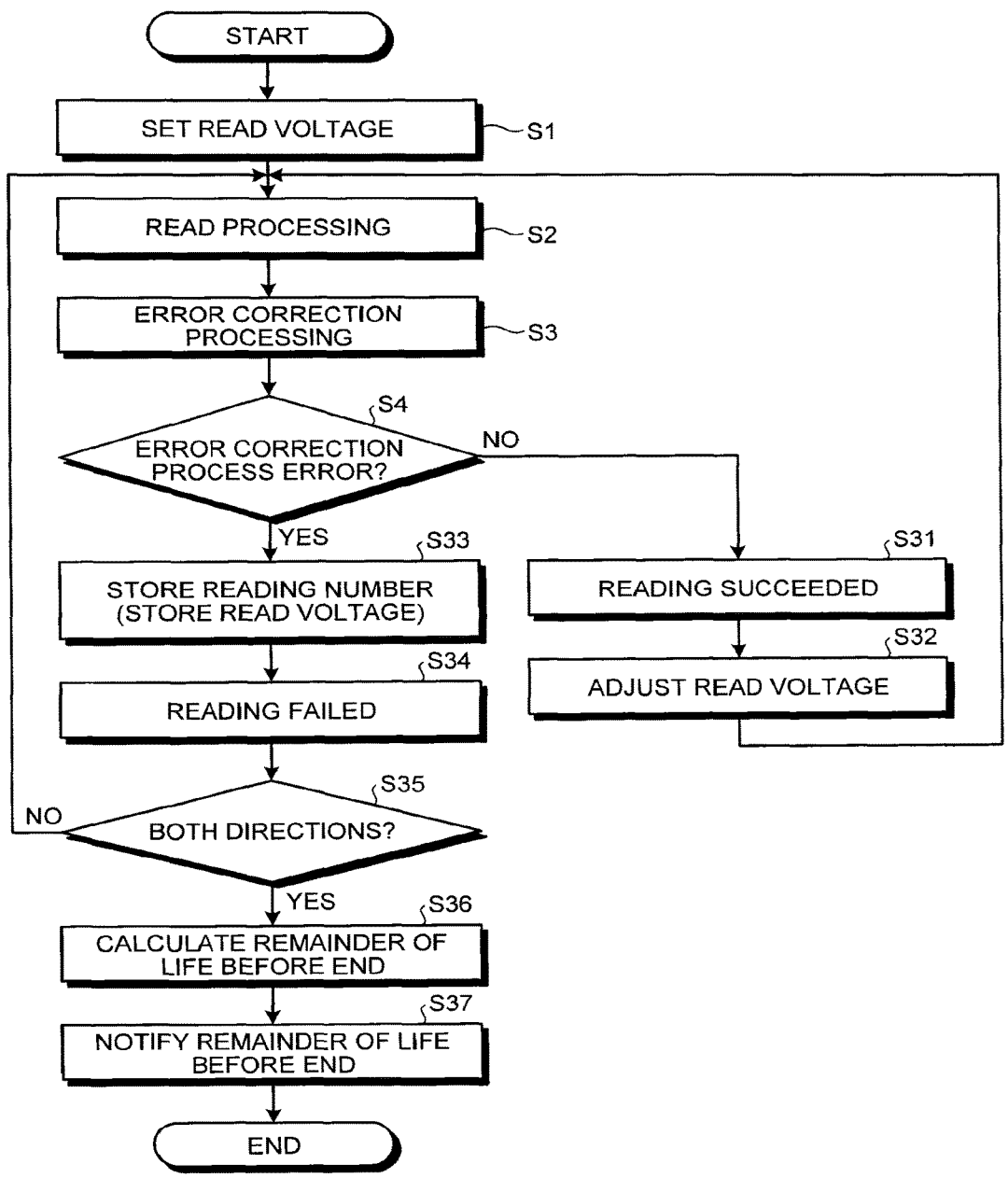
FIG. 19 is a flowchart showing an operation of the non-volatile semiconductor storage device according to the fourth embodiment.

Further, as shown in FIG. 19, an operation of the SSD 100D differs from the second embodiment in the following points.

In step S4, if the error correction process error is not detected (step S4: No), the process proceeds to step S32 by determining that the reading succeeded (step S31). The changing section 14D of the drive control circuit 4 performs an adjustment to lower or raise the value of the read voltage from the value used in step S2 by the predetermined step width (step S32). The value of the read voltage after the adjustment is sent to the memory chip (NAND memory 20) together with a shift read command, and the memory chip transitions to the process of step S2 and performs the read processing by using the read voltage that has been newly sent.

In step S4, if the error correction process error is detected (step S4: Yes), the monitoring section 12D of the drive control circuit 4 stores the reading number in the rising direction by updating a reading number managing table in the rising direction by the count value of the reading number in the rising direction (step S33). Alternatively, the monitoring section 12D of the drive control circuit 4 may store the reading number in the lowering direction by updating a reading number managing table in the lowering direction by the count value of the reading number in the lowering direction (step S33).

Alternatively, the monitoring section 12D of the drive control circuit 4 may update the read voltage changing amount managing table in the rising direction by the changing amount of the read voltage when the read processing in the rising direction failed (step S33). Alternatively, the monitoring section 12D of the drive control circuit 4 may update the read voltage changing amount managing table in the lowering direction by the changing amount of the read voltage when the read processing in the lowering direction failed (step S33).

Then, the process proceeds to step S35 by determining that the reading had failed (step S34). Next, the drive control circuit 4 determines whether the read voltage has shifted in both of the rising direction and the lowering direction or not (step S35).

If the read voltage has not been shifted in both directions (step S35: No), the changing section 14D of the drive control circuit 4 changes the direction along which the read voltage is shifted, and returns the process to step S2.

If the read voltage has been shifted to both directions (step S35: Yes), the determining section 13 of the drive control circuit 4 calculates a remainder of life of each block in the NAND memory 20 (step S36), and supplies information regarding the remainder of life of each block in the NAND memory 20 to the notification processing section 15.

Then, the notification processing section 15 of the drive control circuit 4 receives the information regarding the remainder of life of each block in the NAND memory 20 from the determining section 13. In accordance with that information, the notification processing section 15 notifies the remainder of life of the NAND memory 20 by using the notification device 21 (step S37). That is, the notification processing section 15 generates notification information indicating the contents to be notified in accordance with the information regarding the remainder of life of each block in the NAND memory 20, and supplies the same to the notification device 21. In response to this, the notification device 21 performs a notification to the user of the remainder of life of the NAND memory 20 in compliance with the notification information.

Figure 22:
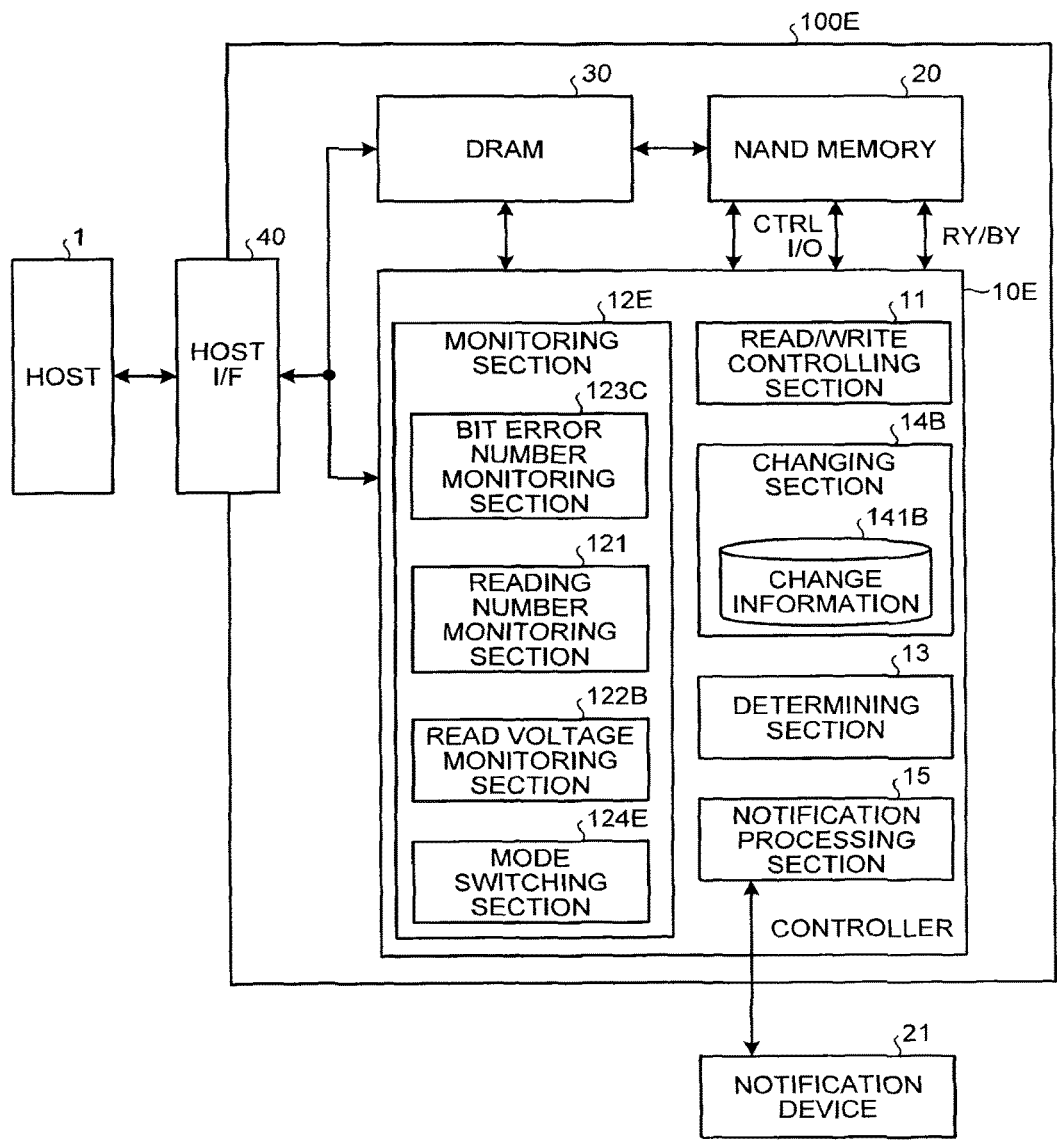
FIG. 22 is a diagram showing a functional configuration of a non-volatile semiconductor storage device in a variant according to the first embodiment to fourth embodiment.

Note that, at least two of the first embodiment to the fourth embodiment may be combined. For example, as shown in FIG. 22, a controller 10E of an SSD 100E may include a monitoring section 12E. The monitoring section 12E includes a mode switching section 124E for switching a first mode, a second mode, a third mode, and a fourth mode. The monitoring section 12E for example performs the operation in the first embodiment in the first mode, the operation in the second embodiment in the second mode, the operation in the third embodiment in the third mode, and the operation in the fourth embodiment in the fourth mode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system communicating with a host apparatus, the memory system comprising:
a nonvolatile semiconductor memory; and
a controller circuit being configured to receive a read request from the host apparatus,
wherein the controller circuit is configured, in response to the read request, to:
perform a first read operation from the nonvolatile semiconductor memory;
determine whether a first error in first data read by the first read operation is uncorrectable;
if the first error is uncorrectable, perform a second read operation to read from an address of the nonvolatile semiconductor memory from which the first data has been read; and
count the second read operation in a number of retry read operations; and
the controller circuit is configured to send, to the host apparatus, information obtained in accordance with a result of the counting the second read operation in the number of the retry read operations.

2. The memory system according to claim 1, wherein the controller circuit is further configured, in response to the read request, to:
determine whether a second error in second data read by the second read operation is uncorrectable;
if the second error is uncorrectable, perform a third read operation to read from the address of the nonvolatile semiconductor memory from which the first data has been read; and
count the third read operation in the number of the retry read operations.

3. The memory system according to claim 1, wherein the information relates to degree of deterioration of the memory system.

4. The memory system according to claim 1, wherein the controller circuit compares the number of the retry read operations with a predetermined value, and the information indicates a result of the comparison.

5. The memory system according to claim 1, wherein the nonvolatile semiconductor memory includes:
a word line; and
a plurality of memory cells connected to the word line,
in a case that the controller circuit performs the first read operation from the nonvolatile semiconductor memory, a first voltage is applied to the word line, and
in a case that the controller circuit performs the second read operation from the nonvolatile semiconductor memory, a second voltage is applied to the word line, the second voltage being different from the first voltage.

6. The memory system according to claim 1, wherein the nonvolatile semiconductor memory includes a plurality of memory cells, and
each of the plurality of memory cells is able to store two or more than two bits of data.

7. The memory system according to claim 1, wherein the nonvolatile semiconductor memory is a NAND type flash memory.

8. The memory system according to claim 1, wherein the nonvolatile semiconductor memory includes:
a word line; and
a plurality of memory cells connected to the word line, in a case that the controller circuit performs the first read operation from the nonvolatile semiconductor memory, a first voltage is applied to the word line, and in a case that the controller circuit performs the second read operation from the nonvolatile semiconductor memory, a second voltage is applied to the word line, the second voltage being substantially equal to the first voltage.

9. The memory system according to claim 2, wherein the nonvolatile semiconductor memory includes:
   a word line; and
   a plurality of memory cells connected to the word line,
in a case that the controller circuit performs the first read operation from the nonvolatile semiconductor memory, a first voltage is applied to the word line, and
in a case that the controller circuit performs the second read operation from the nonvolatile semiconductor memory, a second voltage is applied to the word line, the second voltage being different from the first voltage, and
in a case that the controller circuit performs the third read operation from the nonvolatile semiconductor memory, a third voltage is applied to the word line, the third voltage being different from the first voltage, the third voltage being different from the second voltage.

10. The memory system according to claim 4, wherein the controller circuit compares the number of the retry read operations with a reading number threshold and determines the degree of deterioration of the memory system in accordance with a result of the comparison.

11. The memory system according to claim 10, wherein the controller circuit identifies a distribution of the number of the retry read operations, compares a frequency of the number of the retry read operations with a frequency threshold, and determines the degree of deterioration of the memory system in accordance with a result of the comparison.

* * * * *